United States Patent
Hwang et al.

(10) Patent No.: US 10,950,845 B2
(45) Date of Patent: Mar. 16, 2021

(54) BATTERY PROTECTION CIRCUIT MODULE PACKAGE

(71) Applicant: ITM SEMICONDUCTOR CO., LTD, Chungcheongbuk-do (KR)

(72) Inventors: Ho-seok Hwang, Gunpo-si (KR); Young-Seok Kim, Cheongju-si (KR); Seong-beom Park, Guri-si (KR); Sang-hoon Ahn, Cheongju-si (KR); Tae Hwan Jung, Chungcheongbuk-do (KR); Seung-uk Park, Cheonan-si (KR); Jae-ku Park, Chungcheongbuk-do (KR); Myoung-Ki Moon, Wonju-si (KR); Hyun-suck Lee, Chungcheongbuk-do (KR); Da-Woon Jung, Gangwon-do (KR)

(73) Assignee: ITM SEMICONDUCTOR CO., LTD, Chungcheongbuk-do (KR)

( * ) Notice: Subject to any disclaimer, the term of this patent is extended or adjusted under 35 U.S.C. 154(b) by 283 days.

(21) Appl. No.: 16/253,433

(22) Filed: Jan. 22, 2019

(65) Prior Publication Data
US 2019/0157653 A1 May 23, 2019

Related U.S. Application Data

(62) Division of application No. 14/784,324, filed as application No. PCT/KR2014/003345 on Apr. 17, 2014, now abandoned.

(30) Foreign Application Priority Data

Apr. 17, 2013 (KR) .................. 10-2013-0042566
Apr. 19, 2013 (KR) .................. 10-2013-0043289
(Continued)

(51) Int. Cl.
*H01M 2/34* (2006.01)
*H01M 2/10* (2006.01)
(Continued)

(52) U.S. Cl.
CPC .......... *H01M 2/34* (2013.01); *H01M 2/1061* (2013.01); *H01M 10/4257* (2013.01);
(Continued)

(58) Field of Classification Search
CPC .. H01M 2/34; H01M 2/1061; H01M 10/4257; H01M 10/48; H02J 7/0029
See application file for complete search history.

(56) References Cited

U.S. PATENT DOCUMENTS 7,633,763 B1    12/2009  Park et al.
7,692,405 B2 *   4/2010  Kim .................. H02J 7/0031
                                                  320/134
(Continued)

FOREIGN PATENT DOCUMENTS

CN    101119035 A    2/2008
CN    101779323 A    7/2010
(Continued)

*Primary Examiner* — Scott Bauer
(74) *Attorney, Agent, or Firm* — Novick, Kim & Lee, PLLC; Sang Ho Lee

(57) ABSTRACT

Provided is a battery protection circuit module package capable of easily achieving high integration and size reduction. The battery protection circuit module package includes a terminal lead frame including a first internal connection terminal lead and a second internal connection terminal lead provided at two edges of the terminal lead frame and electrically connected to electrode terminals of a battery bare cell, and a plurality of external connection terminal leads provided between the first and second internal connection terminal leads and serving as a plurality of external connection terminals, and a device package including a substrate mounted on the terminal lead frame to be electri-
(Continued)

cally connected to the terminal lead frame, and providing a battery protection circuit device thereon.

19 Claims, 18 Drawing Sheets

(30) Foreign Application Priority Data

| Apr. 19, 2013 | (KR) | ......................... 10-2013-0043290 |
| Apr. 19, 2013 | (KR) | ......................... 10-2013-0043291 |
| Apr. 25, 2013 | (KR) | ......................... 10-2013-0046036 |

(51) Int. Cl.
 *H01M 10/42* (2006.01)
 *H01M 10/48* (2006.01)
 *H02J 7/00* (2006.01)

(52) U.S. Cl.
 CPC ............ *H01M 10/48* (2013.01); *H02J 7/0029* (2013.01); *H01L 2224/48145* (2013.01); *H01L 2224/48247* (2013.01); *H01L 2224/49111* (2013.01); *H01L 2924/19105* (2013.01); *H01M 2010/4278* (2013.01); *H01M 2200/00* (2013.01); *H01M 2200/106* (2013.01); *H01M 2220/30* (2013.01)

(56) References Cited

U.S. PATENT DOCUMENTS

| 9,142,812 | B2* | 9/2015 | Hwang | ............. H01M 10/4257 |
| 2002/0004163 | A1 | 1/2002 | Matsuura | |
| 2005/0136324 | A1 | 6/2005 | Yamada et al. | |
| 2006/0040179 | A1 | 2/2006 | Bang | |
| 2006/0076930 | A1 | 4/2006 | Ooshita et al. | |
| 2006/0257723 | A1* | 11/2006 | Tan | ........................ H01M 2/34 |
| | | | | 429/65 |
| 2006/0263988 | A1 | 11/2006 | Takahashi et al. | |
| 2010/0143793 | A1* | 6/2010 | Yamamoto | .......... H01M 2/1022 |
| | | | | 429/175 |
| 2011/0278709 | A1* | 11/2011 | Lu | ........................... H01L 25/18 |
| | | | | 257/676 |
| 2014/0033814 | A1 | 2/2014 | Wen | |
| 2015/0022929 | A1* | 1/2015 | Sha | ........................ H02H 9/044 |
| | | | | 361/93.8 |

FOREIGN PATENT DOCUMENTS

| CN | 101919087 A | 12/2010 |
| CN | 101926021 A | 12/2010 |
| JP | 2007-26879 A | 2/2007 |
| JP | 2010-165532 A | 7/2010 |
| KR | 10-2007-0044544 A | 4/2007 |
| KR | 10-0791551 B1 | 1/2008 |
| KR | 10-2009-0081649 A | 7/2009 |
| KR | 10-2011-0071798 A | 6/2011 |
| KR | 10-1087046 B1 | 11/2011 |
| KR | 10-1133054 B1 | 4/2012 |

\* cited by examiner

BATTERY PROTECTION CIRCUIT MODULE PACKAGE

CROSS-REFERENCE TO RELATED APPLICATIONS

The instant application is a divisional of U.S. application Ser. No. 14/784,324 (filed on Oct. 14, 2015), which is a national-stage entry under 35 USC 371 of international application No. PCT/KR2014/003345 (filed on Apr. 17, 2014), and claims priority to Korean patent application Nos. 10-2013-0042566 (filed on Apr. 17, 2013), 10-2013-0043290 (filed on Apr. 19, 2013), 10-2013-0043291 (filed on Apr. 19, 2013), 10-2013-0043289 (filed on Apr. 19, 2013), and 10-2013-0046036 (filed on Apr. 25, 2013), the entire disclosures of which are hereby incorporated by reference.

TECHNICAL FIELD

The present invention relates to a battery protection circuit module package and, more particularly, to a battery protection circuit module package producible in a small size and easily mountable in a battery pack or a battery can.

BACKGROUND ART

A battery is generally used in portable devices such as a mobile phone and a personal digital assistant (PDA). As a battery most commonly used in the portable devices, a lithium ion battery is heated when overcharge or overcurrent occurs, and even has the risk of explosion as well as performance degradation if heating is continued and thus temperature thereof is increased. Accordingly, a typical battery includes a protection circuit module for detecting and blocking overcharge, overdischarge, and overcurrent, or uses an external protection circuit for detecting overcharge, overdischarge, or heating and blocking operation of the battery from the outside of the battery. This conventional protection circuit is generally produced by soldering a protection integrated circuit (IC), a field effect transistor (FET), resistors, capacitors, etc. on a printed circuit board (PCB). However, the conventional protection circuit may not be produced in a small size because the protection IC, the FET, the resistors, and the capacitors occupy an excessively large space. Furthermore, an additional process is required to mount the protection circuit in a battery pack. After the protection circuit is mounted, a process for connecting external connection terminals or internal connection terminals thereof through wires, wire bonding, the pattern of the PCB, or exposure terminals of the PCB is complicated.

DETAILED DESCRIPTION OF THE INVENTION

Technical Problem

The present invention provides a battery protection circuit module package capable of easily achieving high integration and size reduction. However, the scope of the present invention is not limited thereto.

Technical Solution

According to an aspect of the present invention, there is provided a battery protection circuit module package including a terminal lead frame including a first internal connection terminal lead and a second internal connection terminal lead provided at two edges of the terminal lead frame and electrically connected to electrode terminals of a battery bare cell, and a plurality of external connection terminal leads provided between the first and second internal connection terminal leads and serving as a plurality of external connection terminals, and a device package including a substrate mounted on the terminal lead frame to be electrically connected to the terminal lead frame, and providing a battery protection circuit device thereon.

The device package may provide exposure terminals on a bottom surface of the device package.

The device package may provide exposure terminals on a top surface and a bottom surface of the device package.

The device package may further include a near field communication (NFC) matching device provided on the substrate, and an encapsulant for encapsulating the battery protection circuit device and the NFC matching device to expose the exposure terminals, one of the external connection terminals may be an NFC external connection terminal, and the exposure terminals provided on the top surface of the device package may be provided to electrically interconnect an NFC antenna and the NFC matching device.

The device package may further include an authentication chip circuit composition provided on the substrate, and an encapsulant for encapsulating the battery protection circuit device and the authentication chip circuit composition to expose the exposure terminals, and one of the external connection terminals may be an authentication chip external connection terminal.

The device package may further include a fuel gauge circuit composition provided on the substrate, and an encapsulant for encapsulating the battery protection circuit device and the fuel gauge circuit composition to expose the exposure terminals, and one of the external connection terminals may be a fuel gauge external connection terminal.

The exposure terminals provided on the bottom surface of the device package facing the terminal lead frame may be bonded and electrically connected to at least parts of the terminal lead frame.

The battery protection circuit module package may further include an encapsulant for encapsulating the battery protection circuit device to expose the exposure terminals.

The device package may be mounted on the terminal lead frame using surface mounting technology.

The substrate may include a mounting lead frame having a plurality of mounting leads spaced apart from each other, the battery protection circuit device may be directly mounted on the mounting lead frame and may include a protection integrated circuit (IC), a field effect transistor (FET), and one or more passive devices, and the passive devices may be provided to interconnect at least some of the mounting leads spaced apart from each other, and may further include an electrical connection member for electrically interconnecting any two selected from the group consisting of the protection IC, the FET, and the mounting leads, thereby configuring a battery protection circuit without using a printed circuit board (PCB).

The electrical connection member may include bonding wire or bonding ribbon.

The passive devices may not be inserted and fixed into the mounting lead frame but may be mounted and fixed onto at least parts of a surface of the mounting lead frame using surface mounting technology.

The protection IC and the FET may not be inserted and fixed into the mounting lead frame in a form of a semiconductor package but may be mounted and fixed onto at least parts of a surface of the mounting lead frame using surface mounting technology in a form of a chip die not encapsulated with an encapsulant.

The substrate may include a PCB, and the battery protection circuit device may include a protection IC, an FET, and one or more passive devices provided on the PCB.

The electrode terminals of the battery bare cell may include a plate having first polarity, and an electrode cell provided at a center of the plate and having second polarity, and the first internal connection terminal lead may be directly bonded and electrically connected to the plate having the first polarity, and the second internal connection terminal lead may be directly bonded and electrically connected to the electrode cell having the second polarity.

The terminal lead frame and the device package may be provided at a side part of a top surface of the battery bare cell based on the electrode cell having the second polarity.

The first internal connection terminal lead may be bent in a form of a gull to be bonded to the electrode terminal of the battery bare cell.

The first and second internal connection terminal leads may be bonded to the electrode terminals of the battery bare cell using any one selected from the group consisting of laser welding, resistance welding, soldering, a conductive adhesive (e.g., conductive epoxy), and conductive tape.

The terminal lead frame may be formed of nickel or nickel-plated copper.

The external connection terminals may include four or more external connection terminals.

The battery protection circuit module package may further include a positive temperature coefficient (PTC) structure including a PTC device, a metal layer adhered to a first surface corresponding to any one of a top surface and a bottom surface of the PTC device, and a connecting member adhered to a second surface corresponding to the other of the top surface and the bottom surface of the PTC device, and the metal layer may be bonded and electrically connected to one of the first and second internal connection terminal leads, and the connecting member may be bonded and electrically connected to the electrode terminal of the battery bare cell.

Advantageous Effects

According to embodiments of the present invention, a battery protection circuit module package capable of easily achieving high integration and size reduction may be provided. However, the scope of the present invention is not limited to the above-described effect.

MODE OF THE INVENTION

Figure 1:
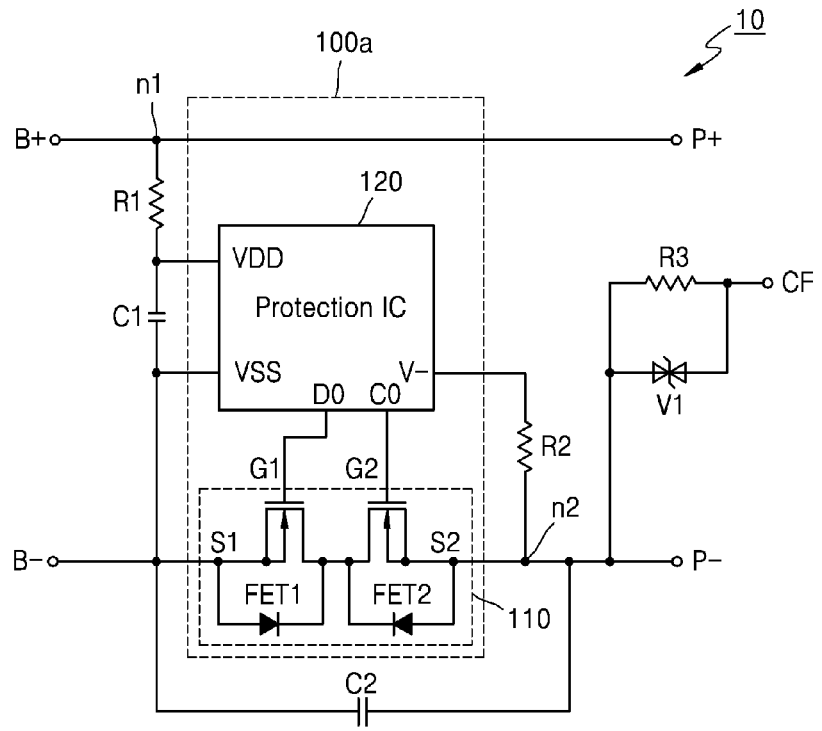
FIG. 1 is a circuit diagram of a battery protection circuit for configuring a battery protection circuit module package, according to an embodiment of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses of layers are exaggerated for clarity.

It will also be understood that when a layer is referred to as being "on" another layer or substrate, it can be directly on the other layer or substrate, or intervening layers may also be present. In the drawings, the thicknesses of layers and regions are exaggerated for clarity. Like reference numerals in the drawings denote like elements. As used herein, the term "and/or" refers to one of or a combination of at least two listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

This application claims the benefit of priority to Korean Patent Application Nos. 10-2013-0042566, 10-2013-0043289, 10-2013-0043290, 10-2013-0043291, and 10-2013-0046036 filed with the Korean Intellectual Property Office, the disclosures of which are incorporated herein by reference in their entirety.

In embodiments of the present invention, a lead frame is an element in which lead terminals are patterned on a metal frame, and may differ from a printed circuit board (PCB) in which a metal wiring layer is provided on an insulating core, in terms of structures or thicknesses thereof.

FIG. 1 is a circuit diagram of a battery protection circuit 10 for configuring a battery protection circuit module package, according to an embodiment of the present invention.

As illustrated in FIG. 1, the battery protection circuit 10 according to an embodiment of the present invention includes first and second internal connection terminals B+ and B− to be connected to a battery cell, and first to third external connection terminals P+, CF, and P− to be connected to a charger for charging and to be connected to an electronic device (e.g., a portable device) operating by battery power, for discharging. Herein, among the first to third external connection terminals P+, CF, and P−, the first and third external connection terminals P+ and P− are used to supply power and the other second external connection terminal CF is used to detect a battery type and perform charging appropriately for the battery type. In addition, the second external connection terminal CF may be provided as a thermistor for detecting battery temperature when charging, and may be used as a terminal having another function.

The battery protection circuit 10 has a structure in which a dual FET chip 110, a protection integrated circuit (IC) 120, resistors R1, R2, and R3, a varistor V1, and capacitors C1 and C2 are connected to each other. The dual FET chip 110 includes first and second field effect transistors FET1 and FET2 having a common drain. The protection IC 120 has a terminal (e.g., VDD) connected through the resistor R1 to the first internal connection terminal B+ serving as (+) terminal of the battery, applying a charge or discharge voltage through a first node n1, and detecting a battery voltage, a reference terminal (e.g., VSS) for providing a reference voltage of an internal operation voltage of the protection IC 120, a detection terminal (e.g., V−) for detecting charge/discharge and overcurrent states, a discharge off signal output terminal (e.g., DO) for switching off the first field effect transistor FET1 in overdischarge state, and a charge off signal output terminal (e.g., CO) for switching off the second field effect transistor FET2 in overcharge state.

Here, the protection IC 120 includes a reference voltage setter, a comparer for comparing a reference voltage and a charge/discharge voltage to each other, an overcurrent detector, and a charge/discharge detector. Herein, reference voltages for determining the charge and discharge states may be changed depending on specifications required by a user, and the charge and discharge states are determined based on the reference voltages by detecting the voltage difference between terminals of the protection IC 120.

The protection IC 120 is configured in such a manner that the terminal DO is changed to LOW state to switch off the first field effect transistor FET1 in overdischarge state, that the terminal CO is changed to LOW state to switch off the second field effect transistor FET2 in overcharge state, and that the second field effect transistor FET2 is switched off when charging and the first field effect transistor FET1 is switched off when discharging in overcurrent state.

The resistor R1 and the capacitor C1 stabilize variations in power supply of the protection IC 120. The resistor R1 is connected between the first node n1 serving as a power (V1) supply node of the battery, and the terminal VDD of the protection IC 120, and the capacitor C1 is connected between the terminal VDD and the terminal VSS of the protection IC 120. Herein, the first node n1 is connected to the first internal connection terminal B+ and the first external connection terminal P+. If the resistor R1 has a high value, when a voltage is detected, the detected voltage is increased due to a current flowing into the protection IC 120. As such, the value of the resistor R1 is set to an appropriate value equal to or less than 1 KΩ. In addition, for stable operation, the capacitor C1 has an appropriate value equal to or greater than 0.01 μF.

The resistors R1 and R2 serve as a current limiter if a charger provides a high voltage exceeding absolute maximum ratings of the protection IC 120 or if the charger is connected with wrong polarity. The resistor R2 is connected between the terminal V− of the protection IC 120 and a second node n2 connected to a source terminal S2 of the second field effect transistor FET2. Since the resistors R1 and R2 are closely related to power consumption, a sum of the values of the resistors R1 and R2 is set to be greater than 1 KΩ. In addition, since recovery may not occur after overcharge blocking if the value of the resistor R2 is excessively large, the value of the resistor R2 is set to a value equal to or less than 10 KΩ.

The capacitor C2 is connected between the second node n2 (or the third external connection terminal P−) and a source terminal S1 of the first field effect transistor FET1 (or the terminal VSS or the second internal connection terminal B−). The capacitor C2 does not exert a strong influence on product features of the battery protection circuit 10, but is added upon a request of the user or for stability. The capacitor C2 is used to achieve system stabilization by improving tolerance to voltage variations or external noise.

The resistor R3 and the varistor V1 are devices for electrostatic discharge (ESD) and surge protection, and are connected in parallel to each other between the second external connection terminal CF and the second node n2 (or the third external connection terminal P−). The varistor V1 is a device for reducing resistance thereof when overvoltage occurs, and may minimize, for example, circuit damage due to overvoltage.

According to an embodiment of the present invention, the battery protection circuit module package is implemented by packaging the battery protection circuit 10 of FIG. 1 which includes the external connection terminals P+, P−, and CF, and the internal connection terminals B+ and B−.

The above-described battery protection circuit 10 according to an embodiment of the present invention is merely an example, and the configuration, number, or disposition of the protection IC 120, the field effect transistors FET1 and FET2, or the passive devices R1, R2, R3, C1, C2, and V1 may be appropriately changed depending on the function of the battery protection circuit 10.

Figure 2:
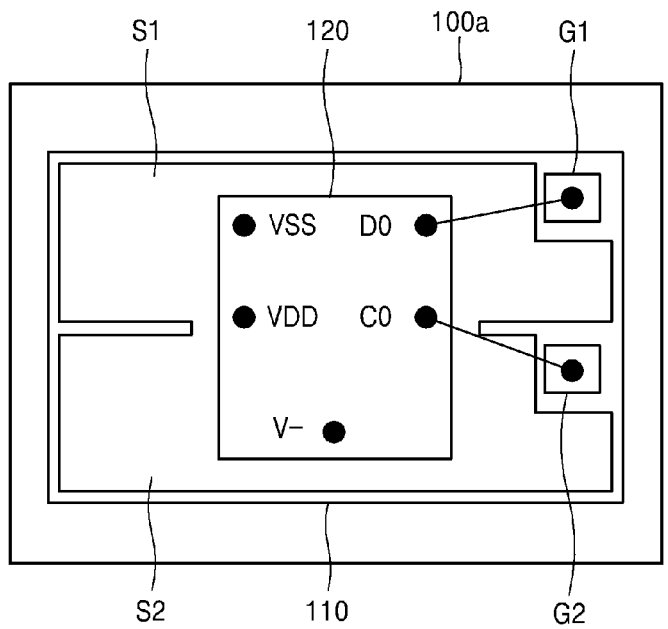
FIG. 2 is a structural view showing the configuration of a multilayer chip for configuring the battery protection circuit module package, according to an embodiment of the present invention.

FIG. 2 is a structural view showing the configuration of a multilayer chip 100a for configuring the battery protection circuit module package, according to an embodiment of the present invention.

As illustrated in FIG. 2, the dual FET chip 110 and the protection IC 120 are stacked on one another or provided adjacent to each other. For example, the protection IC 120 may be stacked on a top surface of the dual FET chip 110, or the dual FET chip 110 may be provided adjacent to a left or right side of the protection IC 120.

The dual FET chip 110 includes two field effect transistors (FETs) having a common drain, i.e., the first and second field effect transistors FET1 and FET2, and external connection terminals include a first gate terminal G1 and a first source terminal S1 of the first field effect transistor FET1 and a second gate terminal G2 and a second source terminal S2 of the second field effect transistor FET2 which are provided on the top surface of the dual FET chip 110. In addition, a common drain terminal D may be provided on a bottom surface of the dual FET chip 110.

The protection IC 120 is stacked on the top surface of the dual FET chip 110. The protection IC 120 is stacked on an area (e.g., a central area) of the dual FET chip 110 other than the area having provided the external connection terminals thereon. In this case, an insulating layer for insulation may be provided between the protection IC 120 and the dual FET chip 110, and the protection IC 120 and the dual FET chip 110 may be bonded to each other using an insulating adhesive. Since the dual FET chip 110 is generally smaller than the protection IC 120, the protection IC 120 is stacked on the dual FET chip 110.

After the protection IC 120 is stacked on the top surface of the dual FET chip 110, the terminal DO of the protection IC 120 is electrically connected to the first gate terminal G1 through wire or wiring, and the terminal CO of the protection IC 120 is electrically connected to the second gate terminal G2 through wire or wiring. A description of connections of the other terminals will be given below. The protection IC 120 and the dual FET chip 110 which are stacked on one another as described above are called 'the multilayer chip 100a'.

In the battery protection circuit module package according to an embodiment of the present invention, by employing the protection IC 120 and the dual FET chip 110 stacked on one another, a mounting area thereof on a lead frame to be described below may be reduced and thus a battery may achieve a small size or a high capacity.

Figure 3:
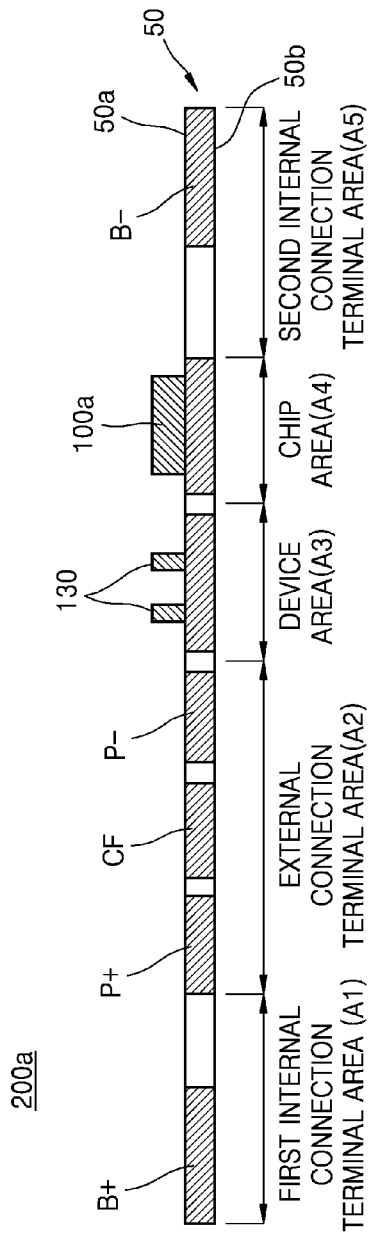
FIG. 3 is a cross-sectional view showing the configurations of a lead frame and a battery protection circuit device for configuring the battery protection circuit module package, according to an embodiment of the present invention.
Figure 4:
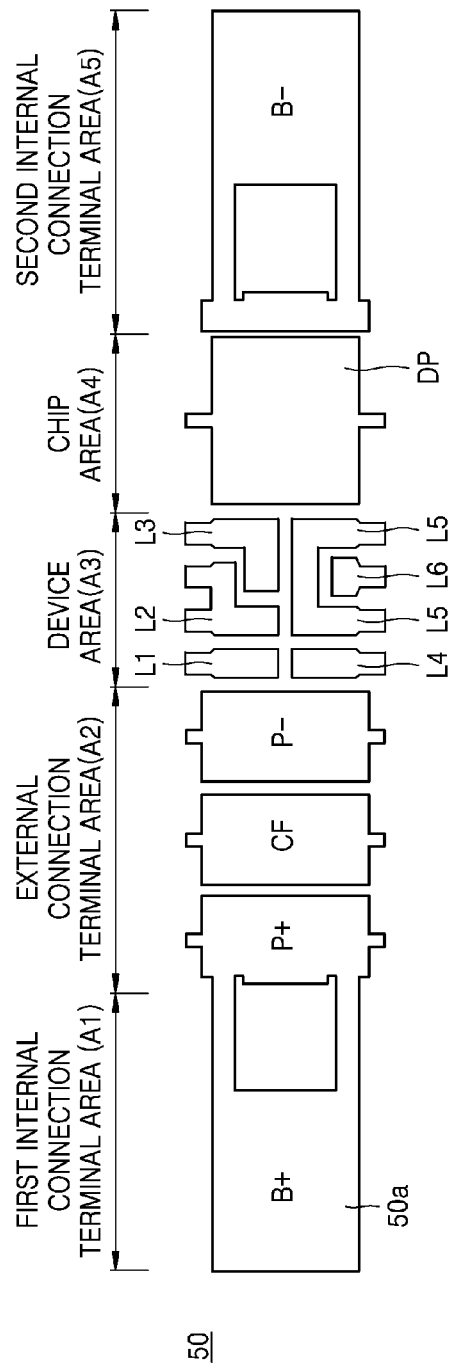
FIG. 4 is a detailed plan view showing the structure of the lead frame for configuring the battery protection circuit module package, according to an embodiment of the present invention.
Figure 5:
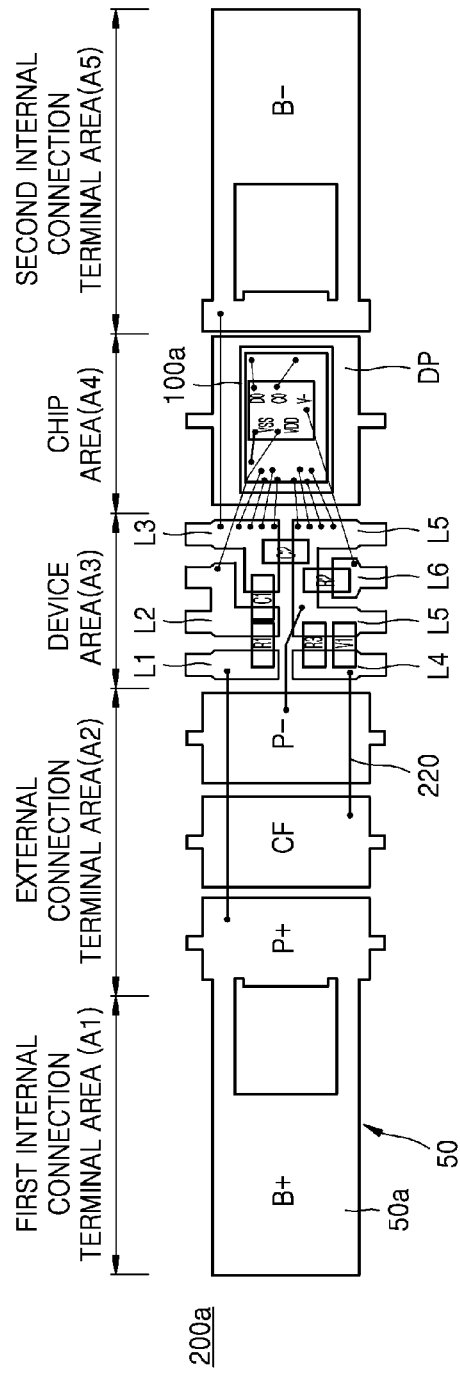
FIG. 5 is a detailed plan view showing the configuration of the battery protection circuit device for configuring the battery protection circuit module package, according to an embodiment of the present invention.

FIG. 3 is a cross-sectional view showing the configurations of a lead frame 50 and a battery protection circuit device 130 and 100a for configuring the battery protection circuit module package, according to an embodiment of the present invention, and FIGS. 4 and 5 are detailed plan views of the lead frame 50 and the battery protection circuit device 130 and 100a illustrated in FIG. 3.

Referring to FIGS. 3 and 4, a protection circuit structure 200a for configuring the battery protection circuit module package according to an embodiment of the present invention is illustrated. The protection circuit structure 200a includes the lead frame 50 and the battery protection circuit device 130 and 100a mounted on the lead frame 50.

The lead frame 50 has a structure in which a first internal connection terminal area A1, an external connection terminal area A2, a protection circuit area of a device area A3 and a chip area A4, and a second internal connection terminal area A5 are sequentially provided. The protection circuit area is provided between the external connection terminal area A2 and the second internal connection terminal area A5, and the order of the device area A3 and the chip area A4 may be changed in various ways. A top surface 50a of the lead frame 50 is a surface for mounting the battery protection circuit device 130 and 100a thereon, and a bottom surface 50b of the lead frame 50 may be a surface opposite to the top surface 50a. A part of the bottom surface 50b of the lead frame 50 corresponding to the external connection terminal area A2 may be entirely or partially plated. A plating material may include at least one selected from the group consisting of gold, silver, nickel, tin, and chromium.

The first and second internal connection terminal areas A1 and A5 are provided at two edges of the module package, and first and second internal connection terminal leads B+ and B− serving as first and second internal connection terminals connected to a battery bare cell accommodated in a battery can are provided thereon, respectively.

The external connection terminal area A2 is provided adjacent to the first internal connection terminal area A1, and first to third external connection terminal leads P+, CF, and P− serving as a plurality of external connection terminals are sequentially provided thereon. The order of the first to third external connection terminal leads P+, CF, and P− may be changed in various ways. Herein, the first external connection terminal lead P+ and the first internal connection terminal lead B+ are connected to each other. That is, the first internal connection terminal lead B+ may extend from the first external connection terminal lead P+, or the first external connection terminal lead P+ may extend from the first internal connection terminal lead B+.

The device area A3 is used to provide thereon the passive devices R1, R2, R3, C1, C2, and V1 for configuring the battery protection circuit 10. Although the device area A3 includes a single lead in FIG. 3 for convenience, the device area A3 may be configured as illustrated in FIG. 4 to provide thereon, for example, first to sixth passive device leads L1, L2, L3, L4, L5, and L6 formed of conductive lines. For example, the first to third passive device leads L1, L2, and L3 may be sequentially provided on an upper part of the device area A3, and the fourth to sixth passive device leads L4, L5, and L6 may be sequentially provided on a lower part of the device area A3.

The first passive device lead L1 is provided with a certain size on the device area A3 adjacent to the external connection terminal area A2, and the second passive device lead L2 is provided adjacent to the first passive device lead L1 with a certain size. The third passive device lead L3 is provided adjacent to the second passive device lead L2 with a certain size on the device area A3 adjacent to the chip area A4.

The fourth passive device lead L4 is provided with a certain size on the device area A3 adjacent to the external connection terminal area A2, and the fifth and sixth passive device leads L5 and L6 are provided adjacent to the fourth passive device lead L4 in such a manner that the fifth passive device lead L5 surrounds the sixth passive device lead L6.

The chip area A4 is an area adjacent to the device area A3 and used to provide thereon the protection IC 120 and the dual FET chip 110 for configuring the battery protection circuit 10. For example, a die pad DP for mounting thereon the multilayer chip 100a illustrated in FIG. 2 may be provided on the chip area A4. The die pad DP may be electrically connected to the common drain terminal of the dual FET chip 110 for configuring the multilayer chip 100a, and may be exposed in a subsequent packaging process to serve as external connection terminals and to improve heat radiation properties.

Referring to FIGS. 3 and 5, the passive devices R1, R2, R3, C1, C2, and V1 and the multilayer chip 100a are provided on the lead frame 50 illustrated in FIG. 4, and the equivalent circuit illustrated in FIG. 1 is configured through, for example, wire bonding 220.

Initially, the multilayer chip 100a is mounted on the die pad DP of the chip area A4, and the reference voltage terminal VSS of the protection IC 120 for configuring the multilayer chip 100a is electrically connected to the source terminal S1 of the first field effect transistor FET1 or the third passive device lead L3 through wire bonding.

The voltage application and battery voltage detection terminal VDD for applying a charge voltage and a discharge voltage in the protection IC 120 is electrically connected to the second passive device lead L2 through, for example, wire bonding, and the detection terminal V− for detecting charge/discharge and overcurrent states in the protection IC 120 is electrically connected to the sixth passive device lead L6 through wire bonding.

The source terminal S1 of the first field effect transistor FET1 is electrically connected to the third passive device lead L3 through, for example, wire bonding, and the source terminal S2 of the second field effect transistor FET2 is electrically connected to the fifth passive device lead L5 through, for example, wire bonding.

Then, the first passive device lead L1 and the first external connection terminal lead P+ are electrically connected to each other through, for example, wire bonding, and the third passive device lead L3 and the second internal connection terminal lead B− are electrically connected to each other through, for example, wire bonding. The fourth passive device lead L4 is electrically connected to the second external connection terminal lead CF through wire bonding, and the fifth passive device lead L5 is electrically connected to the third external connection terminal lead L3 through, for example, wire bonding. Among the plurality of passive devices R1, R2, R3, C1, C2, and V1, the first resistor R1 is provided between the first and second passive device leads L1 and L2, and the second resistor R2 is provided between the fifth and sixth passive device leads L5 and L6.

Among the plurality of passive devices R1, R2, R3, C1, C2, and V1, the third resistor R3 for configuring a surge protection circuit is provided between the fourth and fifth passive device leads L4 and L5, the first capacitor C1 is provided between the second and third passive device leads L2 and L3, and the second capacitor C2 is provided between the third and fifth passive device leads L3 and L5.

Among the plurality of passive devices R1, R2, R3, C1, C2, and V1, the varistor V1 for configuring the surge protection circuit is provided between the fourth and fifth passive device leads L4 and L5 in parallel to the third resistor R3.

The circuit diagram of the battery protection circuit 10 illustrated in FIG. 1 and the protection circuit structure 200a illustrated in FIG. 5 to implement the battery protection circuit 10 may be changed in various ways, and thus a variety of modified structures may be implemented.

For example, in a first modified structure, the first and second field effect transistors FET1 and FET2 and the protection IC 120 may be integrated into one chip. The integrated chip may be mounted on the lead frame 50 in the form of a flip chip. Since the flip chip has external terminals electrically connected to, for example, a lead through soldering instead of wire bonding, compared to the wire bonding process, electrical conductivity may be improved, production costs may be lowered, process simplification may be achieved, and a small space may be occupied.

In a second modified structure, the first and second field effect transistors FET1 and FET2 may not be implemented as a dual FET chip but may be separately provided on the lead frame 50. In this case, to electrically interconnect a drain of the first field effect transistor FET1 and a drain of the second field effect transistor FET2, a conductive plate for interconnecting bottom parts of the lead frame 50 may be additionally provided.

Figure 6:
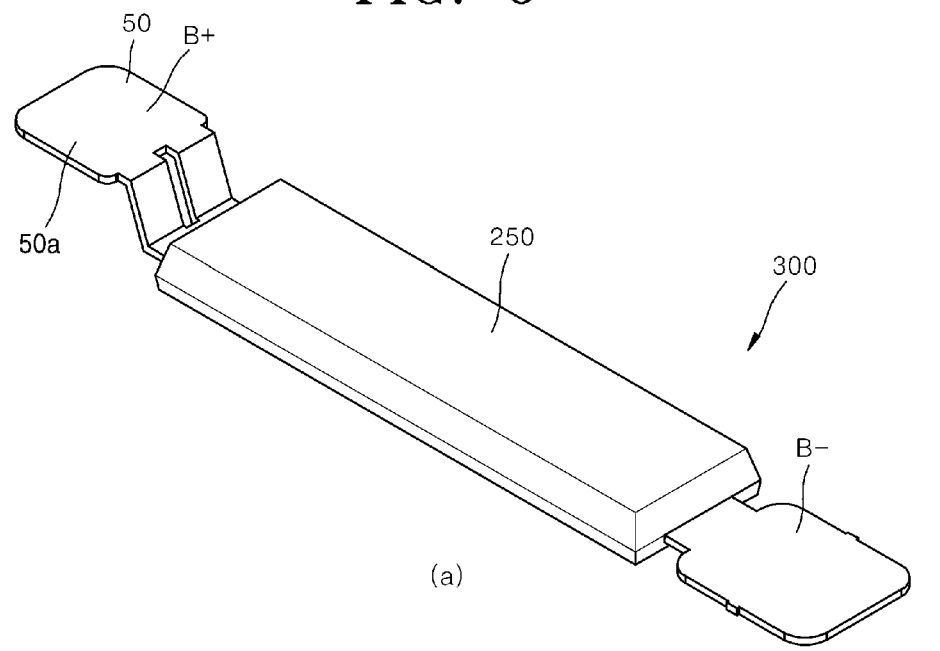
FIG. 6 includes perspective and plan views of a part of a battery protection circuit module package according to an embodiment of the present invention.
Figure 6:
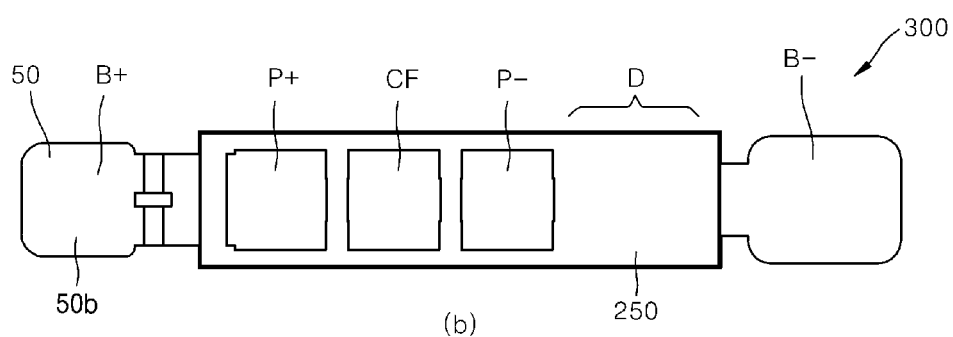

The protection circuit structure 200a illustrated in FIG. 5 or the above-described modified structure may be packaged, e.g., molded with an encapsulant 250, to configure the battery protection circuit module package as illustrated in FIG. 6.

(a) of FIG. 6 illustrates a bottom surface of a battery protection circuit module package 300 according to an embodiment of the present invention, and (b) of FIG. 6 illustrates a top surface of the battery protection circuit module package 300. For example, the bottom surface of the battery protection circuit module package 300 may correspond to the top surface 50a of the lead frame 50, and the top surface of the battery protection circuit module package 300 may correspond to the bottom surface 50b of the lead frame 50. The battery protection circuit module package 300 is configured to expose the external connection terminals P+, CF, and P− on the top surface thereof, and to expose the first and second internal connection terminals B+ and B− on the bottom surface thereof. Herein, the battery protection circuit module package 300 may be packaged to additionally expose a bottom surface of the die pad DP (a surface opposite to the surface having mounted the multilayer chip 100a thereon) on the top surface thereof for heat radiation or another purpose. At least one of the first and second internal connection terminal leads B+ and B− may be bent in the form of a gull.

Figure 7:
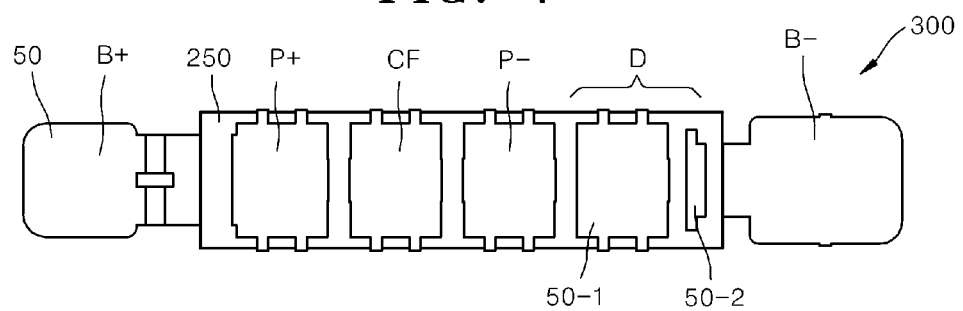
FIG. 7 is a plan view of a part of a battery protection circuit module package according to a comparative example of the present invention.

FIG. 7 is a plan view of a part of a battery protection circuit module package 00 according to a comparative example of the present invention.

As illustrated in FIG. 6, the battery protection circuit module package 300 according to an embodiment of the present invention exposes the three external connection terminals P+, CF, and P− on the top surface thereof, and an area D between the external connection terminals P+, CF, and P− and the second internal connection terminal lead B− corresponds to an area for providing thereon the protection IC 120 and the dual FET chip 110 for configuring the battery protection circuit 10, and an area for providing thereon the passive devices R1, R2, R3, C1, C2, and V1 for configuring the battery protection circuit 10.

As illustrated in FIG. 7, the battery protection circuit module package 300 according to the comparative example of the present invention may expose the three external connection terminals P+, CF, and P− on a top surface thereof, and expose additional external connection terminals 50-1 and 50-2 on the area D. In this case, to additionally ensure an area for providing thereon the protection IC 120 and the dual FET chip 110 for configuring the battery protection circuit 10, and an area for providing thereon the passive devices R1, R2, R3, C1, C2, and V1 for configuring the battery protection circuit 10, the length of the battery protection circuit module package 300 should be increased. However, the battery protection circuit module package 300 is mounted on a top surface of a battery bare cell and thus the length thereof is restricted. Particularly, if the battery protection circuit module package 300 needs to be provided only at a side part based on the center of the top surface of the battery bare cell, the length thereof is further restricted. Therefore, the battery protection circuit module package 300 according to an embodiment of the present invention may not be easily implemented when the number of external connection terminals is equal to or greater than 4. A description is now given of a battery protection circuit module package capable of easily achieving high integration and size reduction when the number of external connection terminals is equal to or greater than 4, according to another embodiment of the present invention.

Figure 9A:
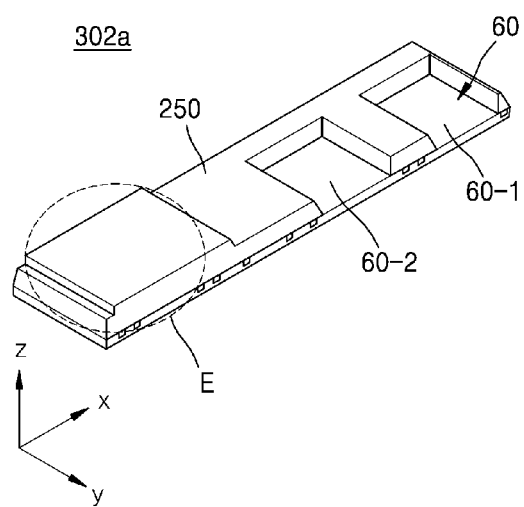
FIGS. 9A and 10A are perspective views of a device package of a battery protection circuit module package, according to some embodiments of the present invention.
Figure 9B:
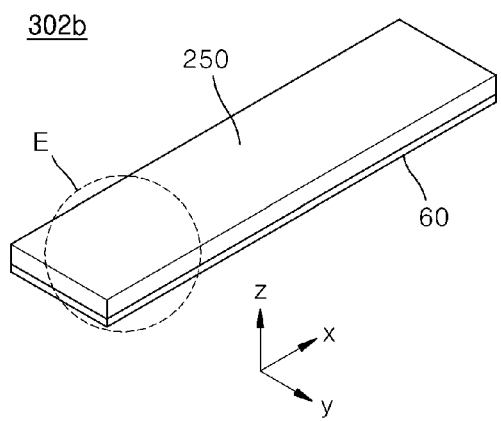
FIGS. 9B and 10B are perspective views of a device package of a battery protection circuit module package, according to other embodiments of the present invention.
Figure 10A:
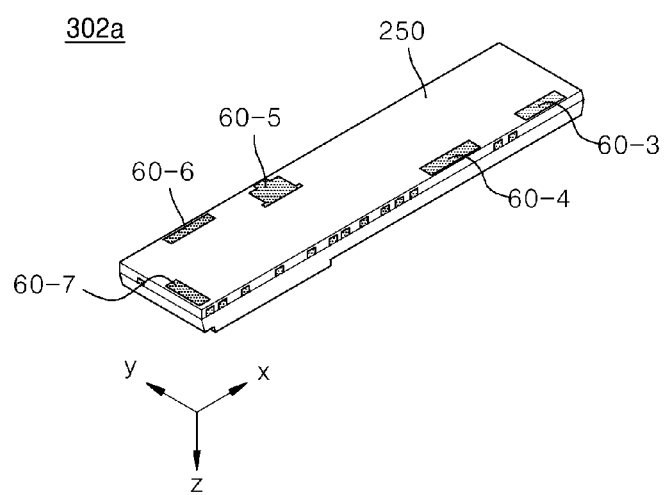
Figure 10B:
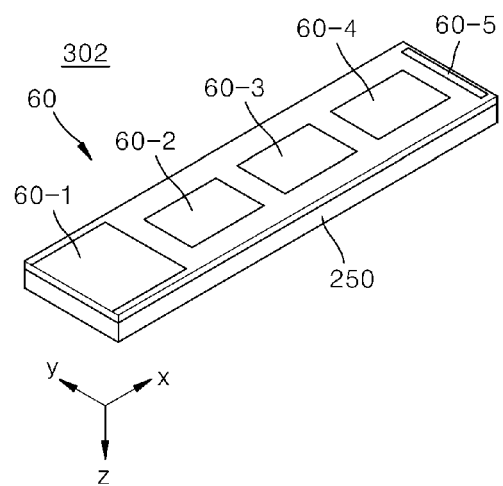
Figure 11:
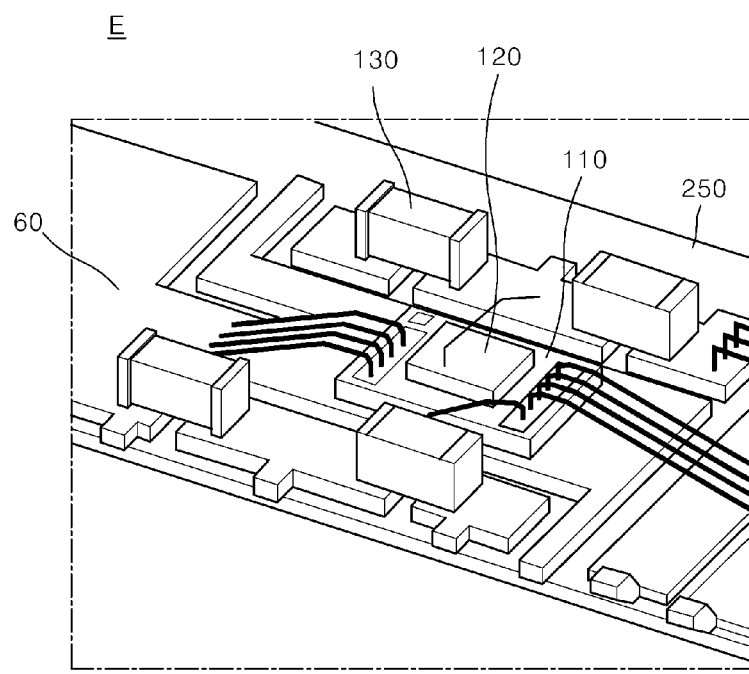
FIG. 11 is a partially exploded perspective view of portion E of FIG. 9A or 9B.
Figure 12A:
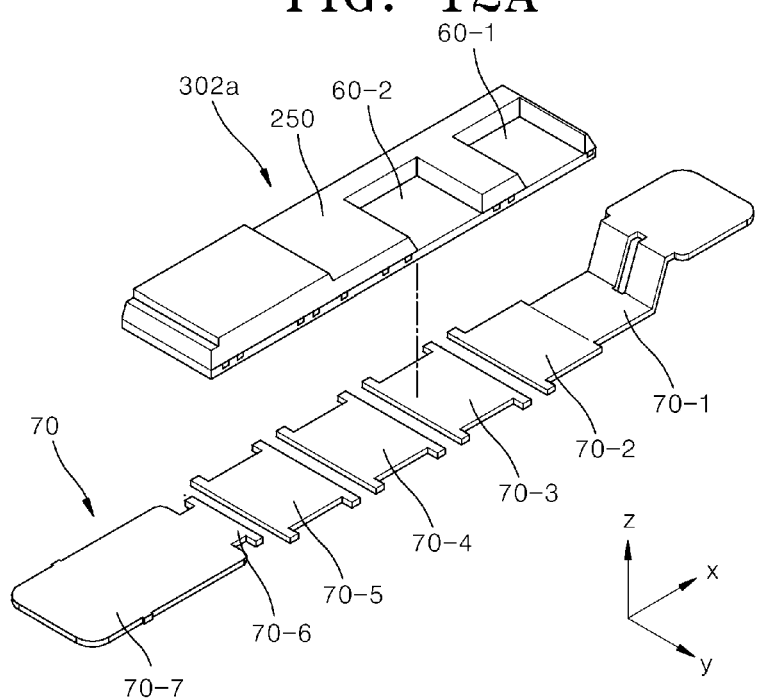
FIG. 12A is a perspective view showing a process for mounting the device package on a terminal lead frame in the battery protection circuit module package, according to some embodiments of the present invention.
Figure 12B:
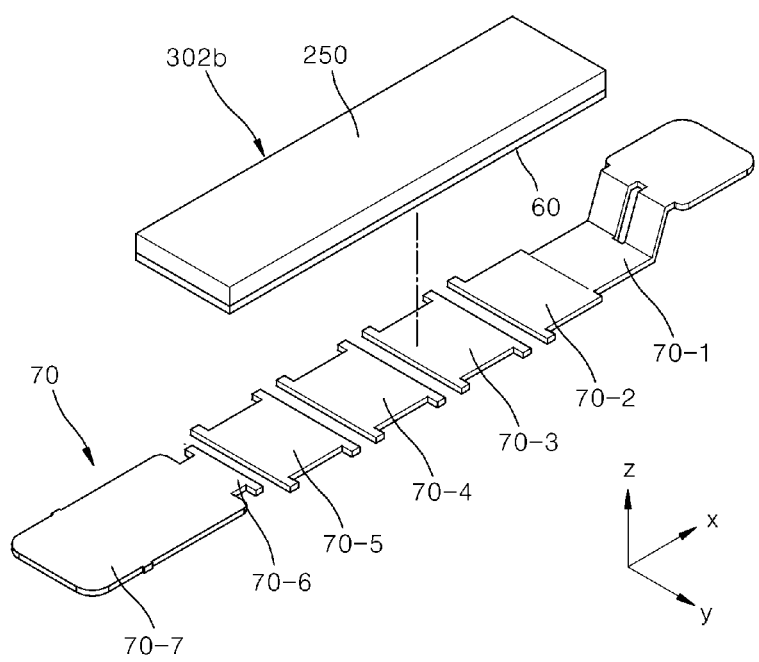
FIG. 12B is a perspective view showing a process for mounting the device package on a terminal lead frame in the battery protection circuit module package, according to other embodiments of the present invention.
Figure 13A:
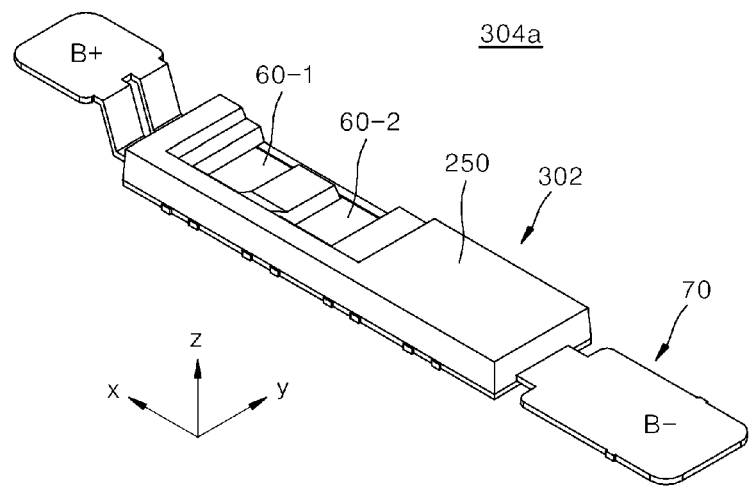
FIG. 13A is a perspective view of the battery protection circuit module package according to some embodiments of the present invention.
Figure 13B:
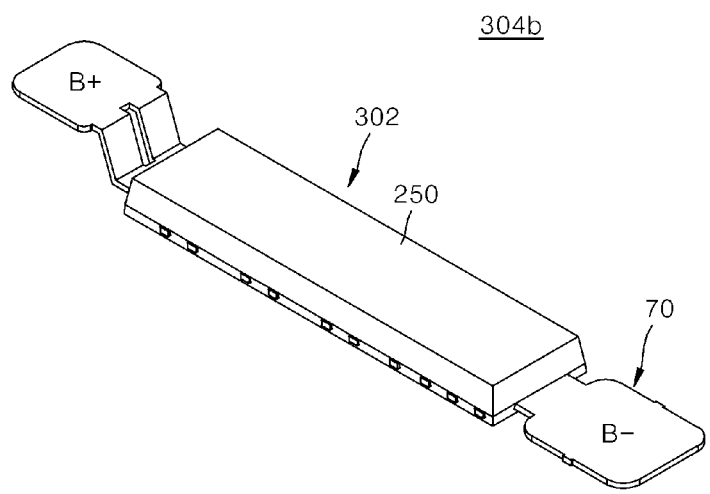
FIG. 13B is a perspective view of the battery protection circuit module package according to other embodiments of the present invention.
Figure 14:
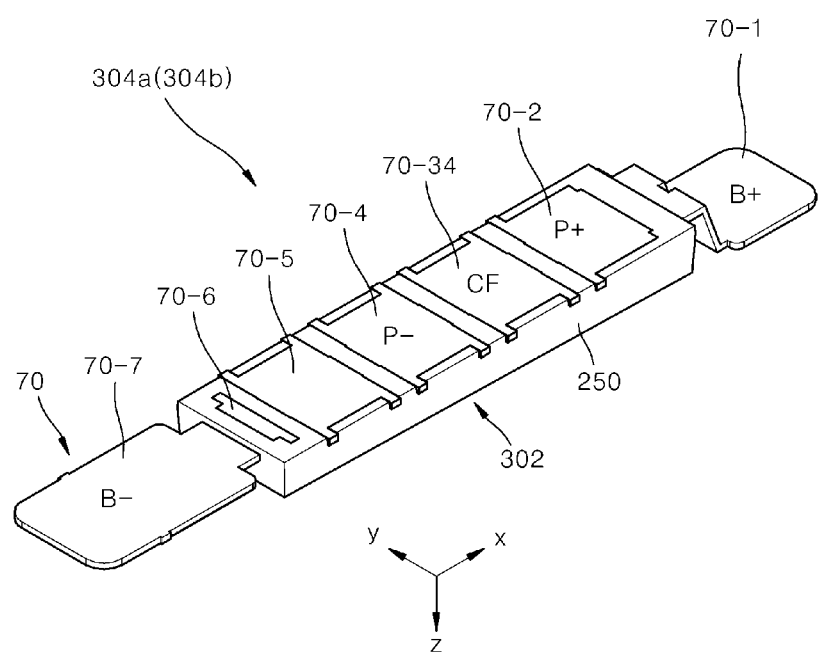
FIG. 14 is a perspective view of the battery protection circuit module package according to embodiments of the present invention.
Figure 15:
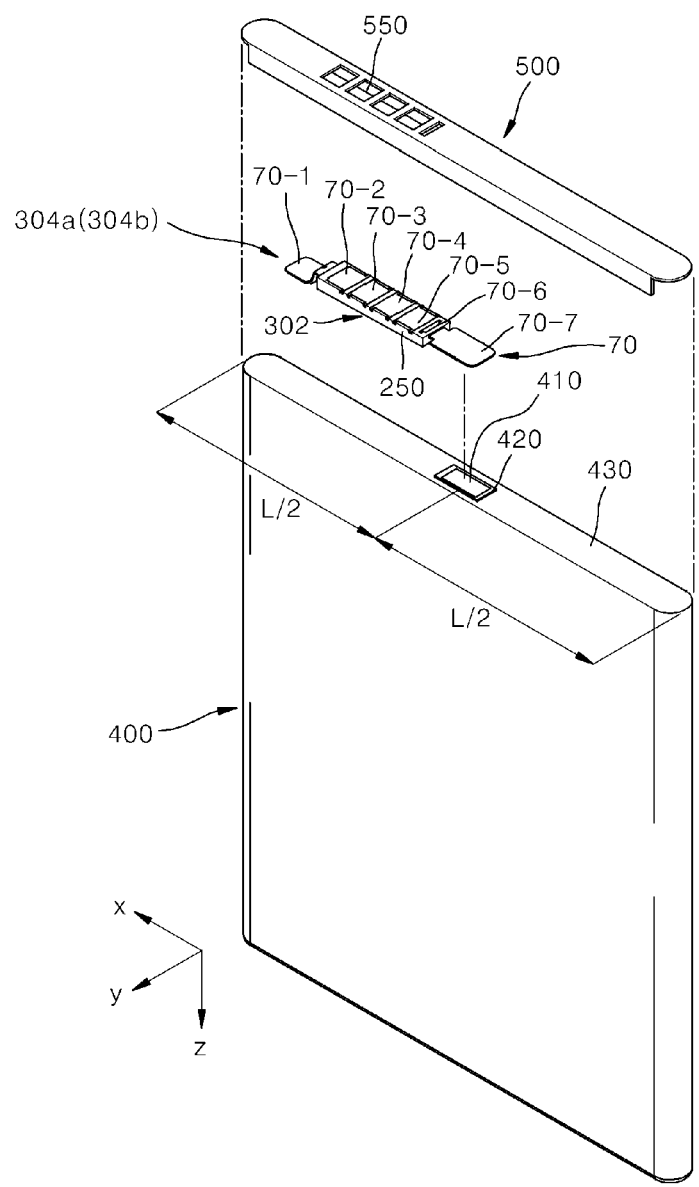
FIG. 15 is a perspective view showing a process for combining the battery protection circuit module package with a battery can, according to at least some embodiments of the present invention.
Figure 19:
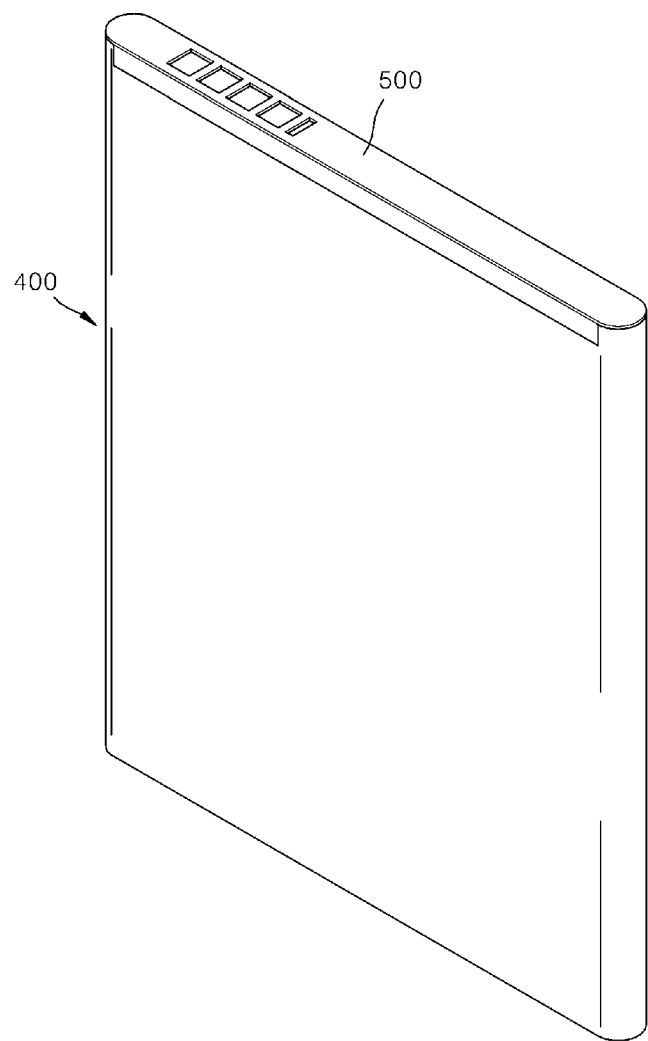
FIG. 19 is a perspective view of a battery pack including the battery protection circuit module package, according to at least some embodiments of the present invention.

FIGS. 9A and 10A are perspective views of a device package 302a of a battery protection circuit module package 304a, according to some embodiments of the present invention, FIG. 11 is a partially exploded perspective view of portion E of FIG. 9A, FIG. 12A is a perspective view showing a process for mounting the device package 302a on a terminal lead frame 70 in the battery protection circuit module package 304a, according to some embodiments of the present invention, FIGS. 13A and 14 are perspective views of the battery protection circuit module package 304a according to some embodiments of the present invention, FIG. 15 is a perspective view showing a process for combining the battery protection circuit module package 304a with a battery can 400, according to at least some embodiments of the present invention, and FIG. 19 is a perspective view of a battery pack 600 including the battery protection circuit module package 304a, according to at least some embodiments of the present invention.

Referring to FIGS. 9A, 10A, 11, 12A, 13A, 14, and 15, the battery protection circuit module package 304a according to another embodiment of the present invention includes the terminal lead frame 70 and the device package 302a.

The terminal lead frame 70 includes first and second internal connection terminal leads 70-1 and 70-7 provided at two edges of the terminal lead frame 70 and electrically connected to electrode terminals 420 and 430 of a battery bare cell, and external connection terminal leads 70-2, 70-3, 70-4, 70-5, and 70-6 provided between the first and second internal connection terminal leads 70-1 and 70-7 and serving as a plurality of external connection terminals. The external connection terminals may include four or more external connection terminals. For example, as illustrated in FIG. 12A, the terminal lead frame 70 may include the fourth and fifth external connection terminal leads 70-5 and 70-6 in addition to the first to third external connection terminal leads P+, CF, and P−. The fifth external connection terminal lead 70-6 may be configured to be connected to the second internal connection terminal lead 70-7 by, for example, changing the design of the terminal lead frame 70, and thus may be used to evaluate electrical properties of the battery protection circuit module package 304a. The terminal lead frame 70 may be formed of nickel, copper, nickel-plated copper, or other metal. Furthermore, surfaces of the external connection terminal leads of the terminal lead frame 70, which face the outside of a battery, (e.g., surfaces illustrated in FIG. 15) may be entirely or partially plated. A plating material may include at least one selected from the group consisting of gold, silver, nickel, tin, and chromium.

The device package 302a includes a substrate having provided a battery protection circuit device 110, 120, and 130 thereon. For example, the device package 302a may include a substrate having provided a field effect transistor (FET) 110, a protection IC 120, and one or more passive devices 130 thereon. The device package 302a may further include an encapsulant 250 for encapsulating the battery protection circuit device 110, 120, and 130. The encapsulant 250 may include, for example, an epoxy molding compound (EMC). The device package 302a is mounted on the terminal lead frame 70 to be electrically connected to the terminal lead frame 70. For example, the device package 302a may be mounted on the terminal lead frame 70 using surface mounting technology. One or more exposure terminals 60-3, 60-4, 60-5, 60-6, and 60-7 may be provided on a bottom surface of the device package 302a. Furthermore, optionally, one or more exposure terminals 60-1 and 60-2 may be provided on a top surface of the device package 302a. The encapsulant 250 for encapsulating the battery protection circuit device 110, 120, and 130 may be provided to expose the exposure terminals 60-1, 60-2, 60-3, 60-4, 60-5, 60-6, and 60-7. The exposure terminals 60-3, 60-4, 60-5, 60-6, and 60-7 provided on the bottom surface of the device package 302a may be bonded and electrically connected to at least parts of the terminal lead frame 70, thereby configuring at least a part of the circuit illustrated in FIG. 1, 8A, 8B, or 8C.

The substrate of the device package 302a capable of providing the battery protection circuit device 110, 120, and 130 thereon may include a lead frame, a printed circuit board (PCB), a ceramic substrate, or a glass substrate.

For example, referring to FIG. 11, the substrate may include a mounting lead frame 60 having a plurality of mounting leads spaced apart from each other. The battery protection circuit device directly mounted on the substrate may include the FET 110, the protection IC 120, and the passive devices 130. The passive devices 130 may include capacitors, resistors, and/or a varistor. In the battery protection circuit module package 304a according to another embodiment of the present invention, the device package 302a including the mounting lead frame 60 may configure a battery protection circuit without using a PCB. This configuration may be implemented by providing the passive devices 130 to interconnect at least some of the mounting leads spaced apart from each other, and providing an electrical connection member for electrically interconnecting any two selected from the group consisting of the protection IC 120, the FET 110, and the mounting leads. The passive devices 130 may not be inserted and fixed into the mounting lead frame 60 but may be mounted and fixed onto at least parts of the surface of the mounting lead frame 60 using surface mounting technology. The electrical connection member may include bonding wire or bonding ribbon.

According to embodiments of the present invention in which the substrate includes the mounting lead frame 60 having the mounting leads spaced apart from each other, since a battery protection circuit is configured by providing the electrical connection member such as bonding wire or bonding ribbon on the mounting lead frame 60, a process for designing and manufacturing the mounting lead frame 60 for configuring the battery protection circuit may be simplified. According to embodiments of the present invention, if the electrical connection member is not employed to configure the battery protection circuit, the configuration of the mounting leads of the mounting lead frame 60 may be very complicated and thus the mounting lead frame 60 may not be appropriately and efficiently provided.

According to embodiments of the present invention in which the substrate is configured with the mounting lead frame 60, the protection IC 120 and the FET 110 may not be inserted and fixed into the mounting lead frame 60 in the form of a semiconductor package but may be mounted and fixed onto at least parts of the surface of the mounting lead frame 60 using surface mounting technology in the form of a chip die not encapsulated with an encapsulant but sawed on a wafer. Herein, the chip die refers to an individual structure not encapsulated with an encapsulant but implemented by performing a sawing process on a wafer having an array of a plurality of structures (e.g., the protection IC 120 and the FET 110) thereon. That is, when the protection IC 120 and the FET 110 are mounted on the mounting lead frame 60, since the protection IC 120 and the FET 110 are mounted in non-encapsulated state and then are encapsulated with the encapsulant 250, only one encapsulation process is necessary to implement the battery protection circuit module package 304a. On the contrary, when the passive devices 130, the protection IC 120, and the FET 110 are inserted and fixed or mounted into a PCB, since each component requires a molding process and then additionally requires another molding process after being fixed or mounted on the PCB, a manufacturing process is complicated and a manufacturing cost is high.

Figure 20:
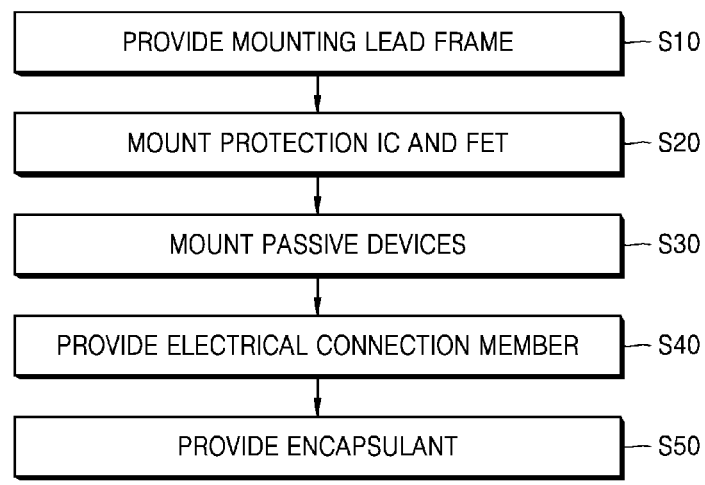
FIG. 20 is a flowchart of a method of manufacturing the device package of the battery protection circuit module package, according to at least some embodiments of the present invention.

FIG. 20 is a flowchart of a method of manufacturing a device package of a battery protection circuit module package, according to at least some embodiments of the present invention.

Referring to FIG. 20, a method of manufacturing the device package 302a in which the substrate is configured with the mounting lead frame 60, according to an embodiment of the present invention, includes providing the mounting lead frame 60 including a plurality of leads spaced apart from each other (S10), mounting the protection IC 120 and the FET 110 on the mounting lead frame 60 (S20), mounting the passive devices 130 on the mounting lead frame 60 to interconnect at least some of the leads, before or after step S20 (S30), providing an electrical connection member for electrically interconnecting any two selected from the group consisting of the protection IC 120, the FET 110, and the leads (S40), and providing the encapsulant 250 for encapsulate the protection IC 120, the FET 110, and the passive devices 130 to expose parts of the mounting lead frame 60 (S50).

In the method according to some embodiments of the present invention, the mounting of the protection IC 120 and the FET 110 on the mounting lead frame 60 in the form of a chip die (S20) and the mounting of the passive devices 130 on the mounting lead frame 60 to interconnect at least some of the leads (S30) may be performed sequentially, in reverse order, simultaneously, or alternately.

The mounting of the protection IC 120 and the FET 110 on the mounting lead frame 60 (S20) includes mounting the protection IC 120 and the FET 110 the mounting lead frame 60 using surface mounting technology in the form of a chip die not encapsulated with an encapsulant but sawed on a wafer.

Meanwhile, the substrate of the device package 302a capable of providing the battery protection circuit device 110, 120, and 130 thereon may include a printed circuit board (PCB). In this case, the battery protection circuit device 110, 120, and 130 may be provided on the PCB.

Referring to FIGS. 15 and 19, the battery protection circuit module package 304a having the above-described structure is inserted between an upper case 500 and a top surface of the battery bare cell accommodated in the battery can 400, thereby configuring the battery pack 600 illustrated in FIG. 19. The upper case 500 is formed of a plastic material and has through holes 550 to expose the external connection terminals P+, CF, and P− and the additional external connection terminals 70-5 and 70-6. The battery pack 600 may be understood as a battery generally used in a mobile phone or a portable device.

The battery bear cell includes an electrode assembly and a cap assembly. The electrode assembly may include a positive plate produced by coating a positive active material on a positive current collector, a negative plate produced by coating a negative active material on a negative current collector, and a separator provided between the positive and negative plates to prevent a short circuit therebetween and allowing lithium ions to move. A positive tap adhered to the positive plate and a negative tap adhered to the negative plate protrude from the electrode assembly.

The cap assembly includes a negative terminal 410, a gasket 420, and a cap plate 430. The cap plate 430 may serve as a positive terminal. The negative terminal 410 may also be called a negative cell or an electrode cell. The gasket 420 may be formed of an insulating material to insulate the negative terminal 410 and the cap plate 430 from each other. Accordingly, electrode terminals of the battery bare cell may include the negative terminal 410 and the cap plate 430.

That is, the electrode terminals of the battery bare cell include a plate 430 having a first polarity (e.g., positive polarity) and an electrode cell 410 having a second polarity (e.g., negative polarity) and provided at the center of the plate 430, and the first internal connection terminal lead B+ of the terminal lead frame 70 may be directly bonded and electrically connected to the plate 430 having the first polarity (e.g., positive polarity) while the second internal connection terminal lead B− of the terminal lead frame 70 may be directly bonded and electrically connected to the electrode cell 410 having the second polarity (e.g., negative polarity). In this case, the length of the terminal lead frame 70 may correspond to a length L/2 from one end of the plate 430 having the first polarity (e.g., positive polarity) to the electrode cell 410 having the second polarity (e.g., negative polarity). According to this embodiment, since the battery protection circuit module package 304*a* has four or more external connection terminals 70-2, 70-3, 70-4, 70-5, and 70-6, and is mounted using only a side part based on the electrode cell 410 having the second polarity (e.g., negative polarity), a battery may achieve a small size or a high capacity. For example, by further providing a cell on the other side part based on the electrode cell 410, the capacity of the battery may be increased or a chip having another function may be additionally provided, and thus products having such battery may be reduced in size.

Furthermore, at least one of the first internal connection terminal lead B+ or 70-1 and the second internal connection terminal lead B− or 70-7 may be bent in the form of a gull to be bonded to the electrode terminal of the battery bare cell. For example, the first internal connection terminal lead B+ or 70-1 may be bent in the form of a gull to be directly bonded and fixed to the plate 430 having the first polarity (e.g., positive polarity). The second internal connection terminal lead B− or 70-7 is bonded and fixed to the negative terminal 410 having the second polarity (e.g., negative polarity). The bonding process may be performed using any one selected from the group consisting of laser welding, resistance welding, soldering, a conductive adhesive (e.g., conductive epoxy), and conductive tape. Accordingly, since the first and second internal connection terminal leads B+ and B− are bonded to the electrode terminals of the battery bare cell, the battery protection circuit module package 304*a* may be stably fixed. Therefore, according to embodiments of the present invention, since a process for bending sides of a lead frame and bonding the bent sides of the lead frame to the battery can 400 accommodating the battery bare cell is not necessary, a manufacturing process may be simplified and a final product, e.g., a battery, may achieve a small size.

According to a modified embodiment of the present invention, instead of the plate 430 having the first polarity (e.g., positive polarity), a first-polarity terminal (not shown) may be provided as the electrode terminal of the battery bare cell. In this case, the first internal connection terminal lead B+ may be directly bonded and electrically connected to the first-polarity terminal, and the second internal connection terminal lead B− may be directly bonded and electrically connected to the electrode cell 410 having the second polarity (e.g., negative polarity). In this case, the length of the lead frame 50 may correspond to a length from the first-polarity terminal to the electrode cell 410 having the second polarity (e.g., negative polarity). Even in this case, since the battery protection circuit module package 304*a* is mounted using only a side part based on the electrode cell 410 having the second polarity (e.g., negative polarity), a battery may achieve a small size or a high capacity.

Figure 8A:
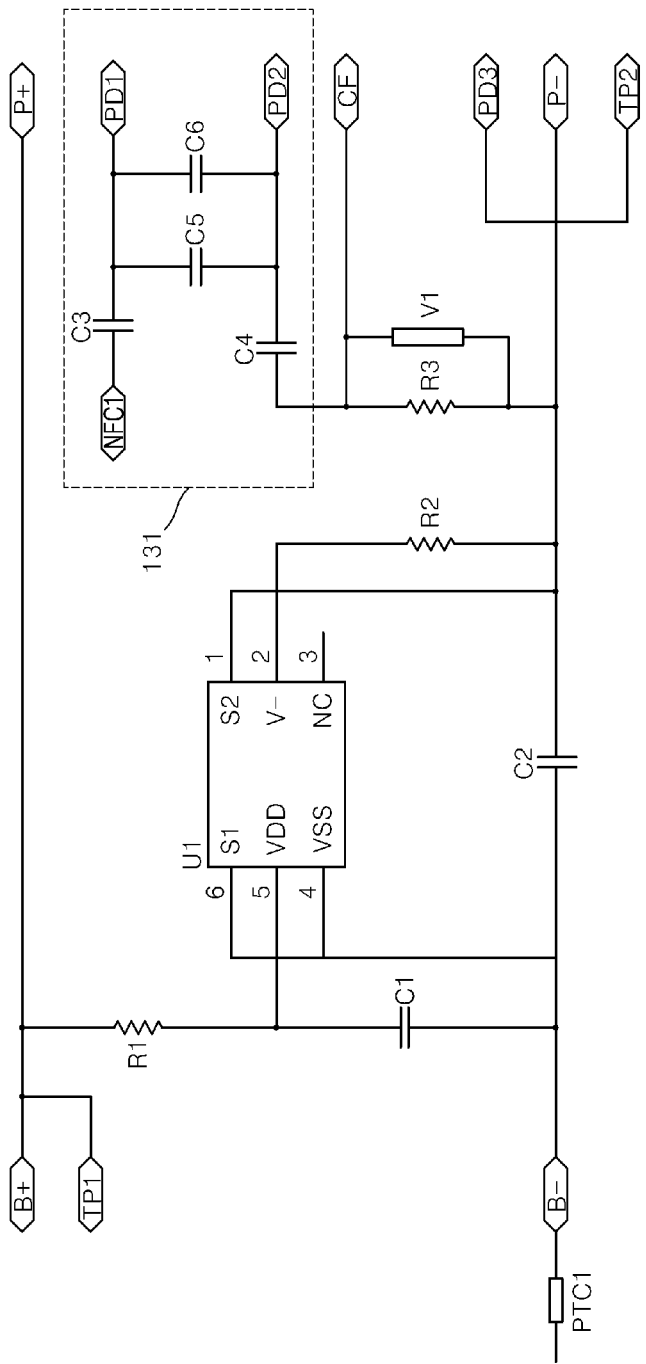
FIG. 8A is a circuit diagram of a battery protection circuit for configuring a part of a battery protection circuit module package, according to another embodiment of the present invention.
Figure 8B:
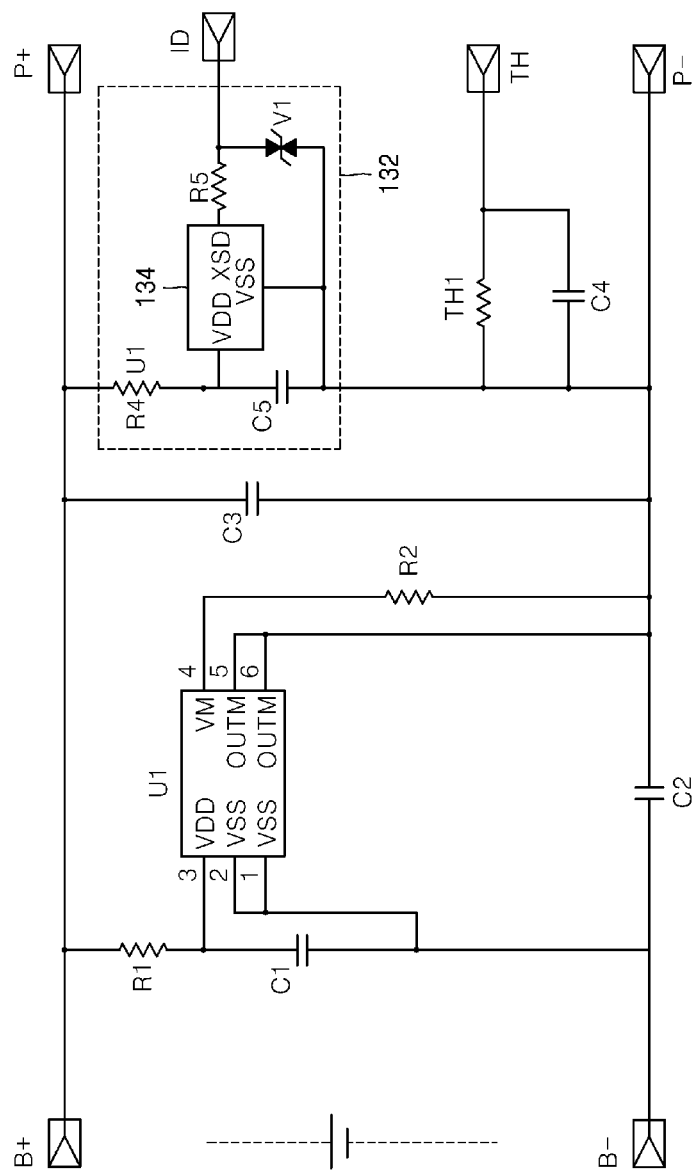
FIG. 8B is a circuit diagram of a battery protection circuit for configuring a part of a battery protection circuit module package, according to another embodiment of the present invention.
Figure 8C:
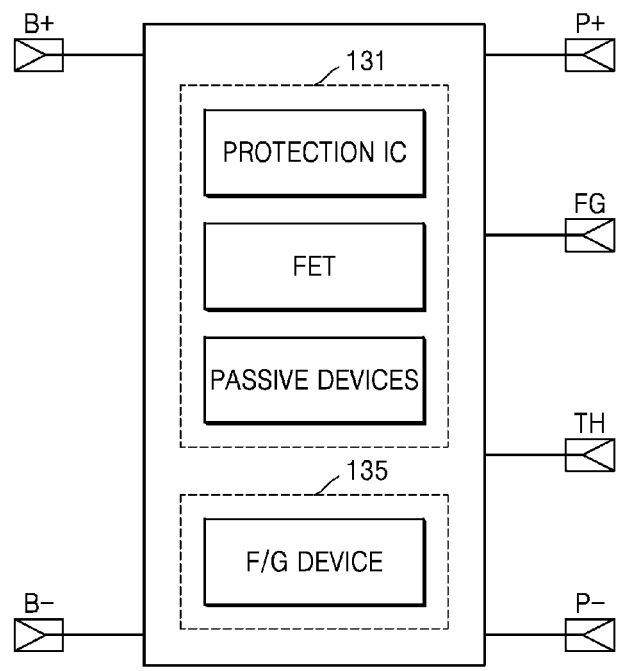
FIG. 8C is a structural view of a battery protection circuit and a fuel gauge circuit for configuring a part of a battery protection circuit module package, according to another embodiment of the present invention.

The above-described configurations of the battery protection circuit module package 304*a* and the battery pack 600 may be applied to implement battery protection circuits illustrated in FIGS. 8A to 8C.

FIG. 8A is a circuit diagram of a battery protection circuit for configuring a part of a battery protection circuit module package, according to another embodiment of the present invention.

Referring to FIG. 8A, a near field communication (NFC) circuit 131 may be added to the configuration of the battery protection circuit 10 illustrated in FIG. 1, thereby supporting NFC communication. The NFC circuit 131 may include, for example, an NFC external connection terminal NFC1, NFC access terminals PD1 and PD2, and NFC matching devices C3, C4, C5, and C6. The NFC access terminals PD1 and PD2 may contact ends of an NFC antenna (not shown) provided near a battery pack. The NFC antenna may be, for example, a loop-type antenna. If the ends of the NFC antenna contact the NFC access terminals PD1 and PD2, the NFC matching devices C3, C4, C5, and C6 and the NFC antenna may be electrically interconnected to form a closed loop. The NFC matching devices C3, C4, C5, and C6 may be, for example, capacitors for frequency matching. For example, the two ends of the NFC loop antenna may be connected to the NFC matching devices C3, C4, C5, and C6, e.g., capacitors, to form a closed loop, and communication with an NFC device may be performed by generating a frequency region of 13.56 MHz for NFC communication using resonance generated from the NFC antenna and the capacitors.

When the NFC circuit 131 is added to the configuration of the battery protection circuit 10 illustrated in FIG. 1, since the NFC external connection terminal NFC1 is configured in addition to the three external connection terminals P+, CF, and P−, the number of external connection terminals included in the battery protection circuit module package is 4. As described above in relation to FIG. 7, the battery protection circuit module package 300 according to an embodiment of the present invention may not be easily implemented when the number of external connection terminals is equal to or greater than 4. The NFC external connection terminal NFC1 may correspond to the fourth external connection terminal 50-1 of the battery protection circuit module package 300 illustrated in FIG. 7. A battery protection circuit module package and a battery pack capable of easily achieving high integration and size reduction when the number of external connection terminals is equal to or greater than 4, according to another embodiment of the present invention are now described with reference to FIGS. 9A, 10A, 11, 12A, 13A, 14, 15, and 19. However, the descriptions given above are omitted herein to avoid redundancy.

In the battery protection circuit module package 304*a* according to another embodiment of the present invention, the terminal lead frame 70 includes the external connection terminal leads 70-2, 70-3, 70-4, 70-5, and 70-6 serving as a plurality of external connection terminals. The external connection terminals may include four or more external connection terminals. For example, as illustrated in FIG. 14, the terminal lead frame 70 may include the fourth and fifth external connection terminal leads 70-5 and 70-6 in addition to the first to third external connection terminal leads P+, CF, and P−. The fourth external connection terminal lead 70-5 may be the NFC external connection terminal NFC1 of FIG. 8A. The fifth external connection terminal lead 70-6 may be configured to be connected to the second internal connection terminal lead 70-7 by, for example, changing the design of the terminal lead frame 70, and thus may be used to evaluate electrical properties of the battery protection circuit module package 304a.

The device package 302a includes a substrate having provided the battery protection circuit device 110, 120, and 130 thereon. For example, the device package 302a may include a substrate having provided the FET 110, the protection IC 120, and the passive devices 130 thereon. Furthermore, the NFC matching devices C3, C4, C5, and C6 illustrated in FIG. 8A may be provided on the substrate. The device package 302a may further include the encapsulant 250 for encapsulating the battery protection circuit device 110, 120, and 130 and the NFC matching devices C3, C4, C5, and C6. The encapsulant 250 may include, for example, an epoxy molding compound (EMC).

The exposure terminals 60-3, 60-4, 60-5, 60-6, and 60-7 may be provided on a bottom surface of the device package 302a. Furthermore, optionally, at least the exposure terminals 60-1 and 60-2 may be provided on a top surface of the device package 302a. The exposure terminals 60-1 and 60-2 provided on the top surface of the device package 302a may be, for example, the NFC access terminals PD1 and PD2 illustrated in FIG. 8A. The NFC access terminals PD1 and PD2 may be connected to ends of the NFC antenna, and thus the NFC matching devices C3, C4, C5, and C6 and the NFC antenna may be electrically interconnected to form a closed loop. The encapsulant 250 for encapsulating the battery protection circuit device 110, 120, and 130 and the NFC matching devices C3, C4, C5, and C6 may be provided to expose the exposure terminals 60-1, 60-2, 60-3, 60-4, 60-5, 60-6, and 60-7. The exposure terminals 60-3, 60-4, 60-5, 60-6, and 60-7 provided on the bottom surface of the device package 302a may be bonded and electrically connected to at least parts of the terminal lead frame 70, thereby configuring at least a part of the circuit illustrated in FIG. 8A. The disposition and number of the exposure terminals 60-1, 60-2, 60-3, 60-4, 60-5, 60-6, and 60-7 according to the current embodiment are merely examples and may be changed in various ways depending on the functions of the battery protection circuit and the NFC circuit 131.

The substrate of the device package 302a capable of providing the battery protection circuit device 110, 120, and 130 and the NFC matching devices C3, C4, C5, and C6 thereon may include a lead frame, a printed circuit board (PCB), a ceramic substrate, or a glass substrate.

For example, referring to FIG. 11, the substrate may include the mounting lead frame 60 having a plurality of mounting leads spaced apart from each other. The battery protection circuit device directly mounted on the substrate may include the FET 110, the protection IC 120, and the passive devices 130. The passive devices 130 may include capacitors, resistors, and/or a varistor. In the battery protection circuit module package 304a according to another embodiment of the present invention, the device package 302a including the mounting lead frame 60 may configure a battery protection circuit without using a PCB. This configuration may be implemented by providing the passive devices 130 and/or the NFC matching devices C3, C4, C5, and C6 to interconnect at least some of the mounting leads spaced apart from each other, and providing an electrical connection member for electrically interconnecting any two selected from the group consisting of the protection IC 120, the FET 110, and the mounting leads. The electrical connection member may include bonding wire or bonding ribbon.

FIG. 8B is a circuit diagram of a battery protection circuit for configuring a part of a battery protection circuit module package, according to another embodiment of the present invention.

Referring to FIG. 8B, an authentication chip circuit composition 132 may be added to a battery protection circuit composition including the battery protection circuit 10 illustrated in FIG. 1 or a battery protection circuit composition including the battery protection circuit modified from the battery protection circuit 10 illustrated in FIG. 1, thereby supporting an authentication function. The authentication function may include all additional functions for authenticating or identifying a battery, a device including the battery, and a user using the device. The authentication chip circuit composition 132 may include, for example, an ID chip 134 and one or more passive devices C5, V1, R4, and R5. The number, types, and disposition of the passive devices C5, V1, R4, and R5 for configuring the authentication chip circuit composition 132 illustrated in FIG. 8B are merely examples, and may be changed depending on the purpose or configuration of the authentication function. The authentication chip circuit composition 132 may be connected to an external device through an authentication chip external connection terminal ID.

When the authentication chip circuit composition 132 is added to the configuration of the battery protection circuit 10 illustrated in FIG. 1, since the authentication chip external connection terminal ID is configured in addition to three external connection terminals P+, TH, and P−, the number of external connection terminals included in the battery protection circuit module package is 4. As described above in relation to FIG. 7, the battery protection circuit module package 300 according to an embodiment of the present invention may not be easily implemented in terms of size reduction when the number of external connection terminals is equal to or greater than 4. The authentication chip external connection terminal ID may correspond to the fourth external connection terminal 50-1 of the battery protection circuit module package 300 illustrated in FIG. 7. A battery protection circuit module package and a battery pack capable of easily achieving high integration and size reduction when the number of external connection terminals is equal to or greater than 4, according to another embodiment of the present invention are now described with reference to FIGS. 9B, 10B, 11, 12B, 13B, 14, 15, and 19. However, the descriptions given above are omitted herein to avoid redundancy.

In a battery protection circuit module package 304b according to yet another embodiment of the present invention, the terminal lead frame 70 includes the external connection terminal leads 70-2, 70-3, 70-4, 70-5, and 70-6 serving as a plurality of external connection terminals. The external connection terminals may include four or more external connection terminals. For example, as illustrated in FIG. 14, the terminal lead frame 70 may include the fourth and fifth external connection terminal leads 70-5 and 70-6 in addition to the first to third external connection terminals P+, TH, and P−. For example, the fourth external connection terminal lead 70-5 may be the authentication chip external connection terminal ID of FIG. 8B. The fifth external connection terminal lead 70-6 may be configured to be connected to the second internal connection terminal lead 70-7 by, for example, changing the design of the terminal lead frame 70, and thus may be used to evaluate electrical properties of the battery protection circuit module package 304b.

A device package 302b includes a substrate having provided a battery protection circuit composition 110, 120, and 130 and the authentication chip circuit composition 132 thereon. For example, the device package 302a may include a substrate having provided the FET 110, the protection IC 120, and one or more first passive devices 130 thereon. Herein, the first passive devices 130 may include the passive devices illustrated in FIG. 1 or the passive devices illustrated in FIG. 8B except for the authentication chip circuit composition 132. Furthermore, the ID chip 134 and one or more second passive devices C5, V1, R4, and R5 for configuring the authentication chip circuit composition 132 illustrated in FIG. 8B may be provided on the substrate. The device package 302b may further include the encapsulant 250 for encapsulating the battery protection circuit composition 110, 120, and 130 and the authentication chip circuit composition 132. The encapsulant 250 may include, for example, an epoxy molding compound (EMC).

The device package 302b is mounted on the terminal lead frame 70 to be electrically connected to the terminal lead frame 70. For example, the device package 302b may be mounted on the terminal lead frame 70 using surface mounting technology. One or more exposure terminals 60-1, 60-2, 60-3, 60-4, and 60-5 may be provided on a bottom surface of the device package 302b. The encapsulant 250 for encapsulating the battery protection circuit composition 110, 120, and 130 and the authentication chip circuit composition 132 may be provided to expose the exposure terminals 60-1, 60-2, 60-3, 60-4, and 60-5. The exposure terminals 60-1, 60-2, 60-3, 60-4, and 60-5 provided on the bottom surface of the device package 302b may be bonded and electrically connected to at least parts of the terminal lead frame 70, thereby configuring at least a part of the circuit illustrated in FIG. 8B. The disposition and number of the exposure terminals 60-1, 60-2, 60-3, 60-4, and 60-5 according to the current embodiment are merely examples and may be changed in various ways depending on the functions of the battery protection circuit and the authentication chip circuit composition 132.

The substrate of the device package 302b capable of providing the battery protection circuit composition 110, 120, and 130 and the authentication chip circuit composition 132 thereon may include a lead frame, a printed circuit board (PCB), a ceramic substrate, or a glass substrate.

For example, referring to FIG. 11, the substrate may include the mounting lead frame 60 having a plurality of mounting leads spaced apart from each other. The battery protection circuit composition directly mounted on the substrate may include the FET 110, the protection IC 120, and the first passive devices 130. The first passive devices 130 may include capacitors, resistors, and/or a varistor. The authentication chip circuit composition 132 mounted on the mounting lead frame 60 may include the ID chip 134 and the second passive devices C5, V1, R4, and R5.

Referring to FIG. 20, in a method of manufacturing a device package 302 in which the substrate is configured with the mounting lead frame 60, according to an embodiment of the present invention, step S10 includes providing the mounting lead frame 60 including a plurality of leads spaced apart from each other, step S20 includes mounting the protection IC 120, the FET 110, and the ID chip 134 on the mounting lead frame 60, step S30 performed before or after step S20 includes mounting the first passive devices 130 and/or the second passive devices C5, V1, R4, and R5 on the mounting lead frame 60 to interconnect at least some of the leads, step S40 includes providing an electrical connection member for electrically interconnecting any two selected from the group consisting of the protection IC 120, the FET 110, the ID chip 134, and the leads, and step S50 includes providing the encapsulant 250 for encapsulating the protection IC 120, the FET 110, the ID chip 134, and the passive devices 130 to expose parts of the mounting lead frame 60.

FIG. 8C is a structural view of a battery protection circuit and a fuel gauge circuit for configuring a part of a battery protection circuit module package, according to another embodiment of the present invention.

Referring to FIG. 8C, a fuel gauge circuit composition 135 may be added to a battery protection circuit composition 131 including the battery protection circuit 10 illustrated in FIG. 1 or a battery protection circuit composition 131 including the battery protection circuit modified from the battery protection circuit 10 illustrated in FIG. 1, thereby supporting a fuel gauge function. The battery protection circuit composition 131 may include the FET 110, the protection IC 120, and the passive devices 130. The fuel gauge function may include all or some additional functions for a fuel gauge for a battery, a device including the battery, and a user using the device. The fuel gauge circuit composition 135 may have, for example, functions for measuring the temperature, current, and/or voltage of a battery of a mobile phone to check battery charge of the mobile phone. The fuel gauge circuit composition 135 may include, for example, an F/G device. The F/G device may include a multiplexer and an analog-to-digital (A/D) converter. Furthermore, optionally, the F/G device may further include a microprocessor including embedded memory, and an oscillator. The number, type, and disposition of the fuel gauge circuit composition 135 illustrated in FIG. 8C are merely examples, and may be changed depending on the purpose or configuration of the fuel gauge function. The fuel gauge circuit composition 135 may be connected to an external device through a fuel gauge external connection terminal FG. The fuel gauge external connection terminal FG may include a single terminal or multiple terminals depending on the configuration, disposition, and function of the fuel gauge circuit composition 135, and may be used commonly with the second external connection terminal TH. Although an electrical connection structure between the first and second internal connection terminals B+ and B− and/or the external connection terminals P+, P−, TH, and FG, and the battery protection circuit composition 131 and/or the fuel gauge circuit composition 135 is omitted for convenience in FIG. 8C, an arbitrary electrical connection structure may be provided to implement the functions of a battery protection circuit and a fuel gauge.

When the fuel gauge circuit composition 135 is added to the configuration of the battery protection circuit 10 illustrated in FIG. 1, since the fuel gauge external connection terminal FG is configured in addition to three external connection terminals P+, TH, and P−, the number of external connection terminals included in the battery protection circuit module package is 4. As described above in relation to FIG. 7, the battery protection circuit module package 300 according to an embodiment of the present invention may not be easily implemented in terms of size reduction when the number of external connection terminals is equal to or greater than 4. The fuel gauge external connection terminal FG may correspond to the fourth external connection terminal 50-1 of the battery protection circuit module package 300 illustrated in FIG. 7. A battery protection circuit module package and a battery pack capable of easily achieving high integration and size reduction when the number of external connection terminals is equal to or greater than 4, according to another embodiment of the present invention are now described with reference to FIGS. 9B, 10B, 11, 12B, 13B, 14, 15, and 19. However, the descriptions given above are omitted herein to avoid redundancy.

The battery protection circuit module package 304b according to another embodiment of the present invention includes the terminal lead frame 70 and the device package 302b.

The terminal lead frame 70 includes the external connection terminal leads 70-2, 70-3, 70-4, 70-5, and 70-6 serving as a plurality of external connection terminals. The external connection terminals may include four or more external connection terminals. For example, as illustrated in FIG. 14, the terminal lead frame 70 may include the fourth and fifth external connection terminal leads 70-5 and 70-6 in addition to the first to third external connection terminals P+, TH, and P−. For example, the fourth external connection terminal lead 70-5 may be the fuel gauge external connection terminal FG of FIG. 8C. The fifth external connection terminal lead 70-6 may be configured to be connected to the second internal connection terminal lead 70-7 by, for example, changing the design of the terminal lead frame 70, and thus may be used to evaluate electrical properties of the battery protection circuit module package 304b. When the fuel gauge external connection terminal FG includes multiple terminals, if necessary, additional external connection terminal leads may be further provided on the terminal lead frame 70.

The device package 302b includes a substrate having provided the battery protection circuit composition 110, 120, and 130 and the fuel gauge circuit composition 135 thereon. For example, the device package 302a may include a substrate having provided the FET 110, the protection IC 120, and the passive devices 130 thereon. Herein, the passive devices 130 may include the passive devices illustrated in FIG. 1 or the passive devices illustrated in FIG. 8C except for the fuel gauge circuit composition 135. Furthermore, the F/G device and one or more second passive devices for configuring the fuel gauge circuit composition 135 illustrated in FIG. 8C may be provided on the substrate. The F/G device may include a part of at least one selected from the group consisting of a multiplexer, an A/D converter, a microprocessor including embedded memory, and an oscillator. Alternatively, the F/G device may include a one-chip device including at least any two selected from the group consisting of a multiplexer, an A/D converter, a microprocessor including embedded memory, and an oscillator. The device package 302b may further include the encapsulant 250 for encapsulating the battery protection circuit composition 110, 120, and 130 and the fuel gauge circuit composition 135. The encapsulant 250 may include, for example, an epoxy molding compound (EMC).

The device package 302b is mounted on the terminal lead frame 70 to be electrically connected to the terminal lead frame 70. For example, the device package 302b may be mounted on the terminal lead frame 70 using surface mounting technology. One or more exposure terminals 60-1, 60-2, 60-3, 60-4, and 60-5 may be provided on a bottom surface of the device package 302b. The encapsulant 250 for encapsulating the battery protection circuit composition 110, 120, and 130 and the fuel gauge circuit composition 135 may be provided to expose the exposure terminals 60-1, 60-2, 60-3, 60-4, and 60-5. The exposure terminals 60-1, 60-2, 60-3, 60-4, and 60-5 provided on the bottom surface of the device package 302b may be bonded and electrically connected to at least parts of the terminal lead frame 70, thereby configuring at least a part of the circuit illustrated in FIG. 1 or 8C. The disposition and number of the exposure terminals 60-1, 60-2, 60-3, 60-4, and 60-5 according to the current embodiment are merely examples and may be changed in various ways depending on the functions of the battery protection circuit and the fuel gauge circuit composition 135.

The substrate of the device package 302b capable of providing the battery protection circuit composition 110, 120, and 130 and the fuel gauge circuit composition 135 thereon may include a lead frame, a printed circuit board (PCB), a ceramic substrate, or a glass substrate.

For example, referring to FIG. 11, the substrate may include the mounting lead frame 60 having a plurality of mounting leads spaced apart from each other. The battery protection circuit composition directly mounted on the substrate may include the FET 110, the protection IC 120, and the passive devices 130. The passive devices 130 may include capacitors, resistors, and/or a varistor. The fuel gauge circuit composition 135 mounted on the mounting lead frame 60 may include the F/G device and the second passive devices.

The device package 302b including the mounting lead frame 60 may configure a battery protection circuit without using a PCB. This configuration may be implemented by providing the passive devices 130 and/or the second passive devices to interconnect at least some of the mounting leads spaced apart from each other, and providing an electrical connection member for electrically interconnecting at least any two selected from the group consisting of the FET 110, the protection IC 120, the F/G device, and the mounting leads. The electrical connection member may include bonding wire or bonding ribbon.

Referring to FIG. 20, in a method of manufacturing the device package 302 in which the substrate is configured with the mounting lead frame 60, according to an embodiment of the present invention, step S10 includes providing the mounting lead frame 60 including a plurality of leads spaced apart from each other, step S20 includes mounting the protection IC 120, the FET 110, and the F/G device on the mounting lead frame 60, step S30 performed before or after step S20 includes mounting the passive devices 130 and/or the second passive devices on the mounting lead frame 60 to interconnect at least some of the leads, step S40 includes providing an electrical connection member for electrically interconnecting at least any two selected from the group consisting of the protection IC 120, the FET 110, the F/G device, and the leads, and step S50 includes providing the encapsulant 250 for encapsulating the protection IC 120, the FET 110, the F/G device, and the passive devices 130 to expose parts of the mounting lead frame 60. Step S20 and step S30 may be performed sequentially, in reverse order, simultaneously, or alternately.

Figure 16:
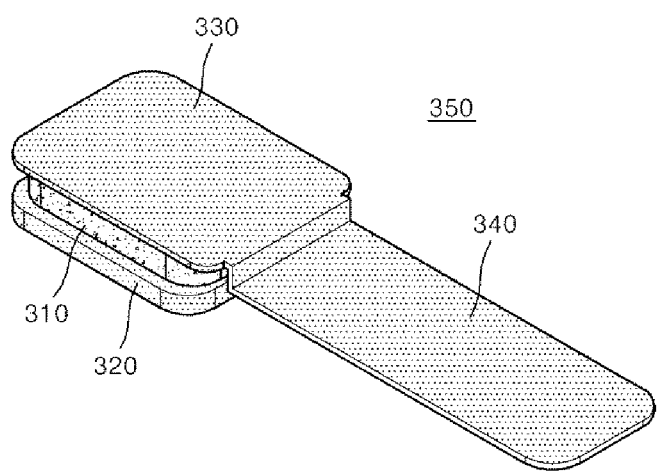
FIG. 16 is a perspective view of a positive temperature coefficient (PTC) structure for configuring the battery protection circuit module package, according to at least some embodiments of the present invention.
Figure 17:
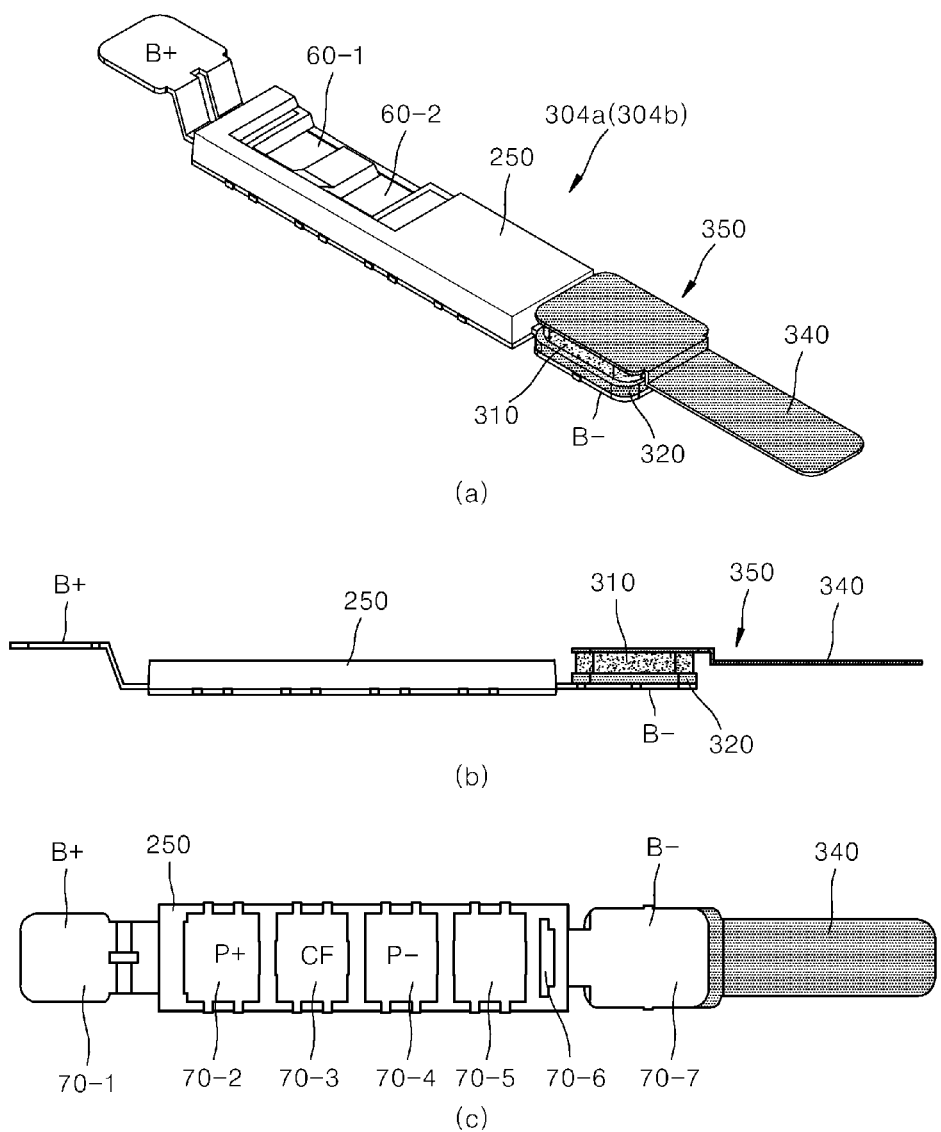
FIG. 17 illustrates the battery protection circuit module package according to at least some embodiments of the present invention.
Figure 18:
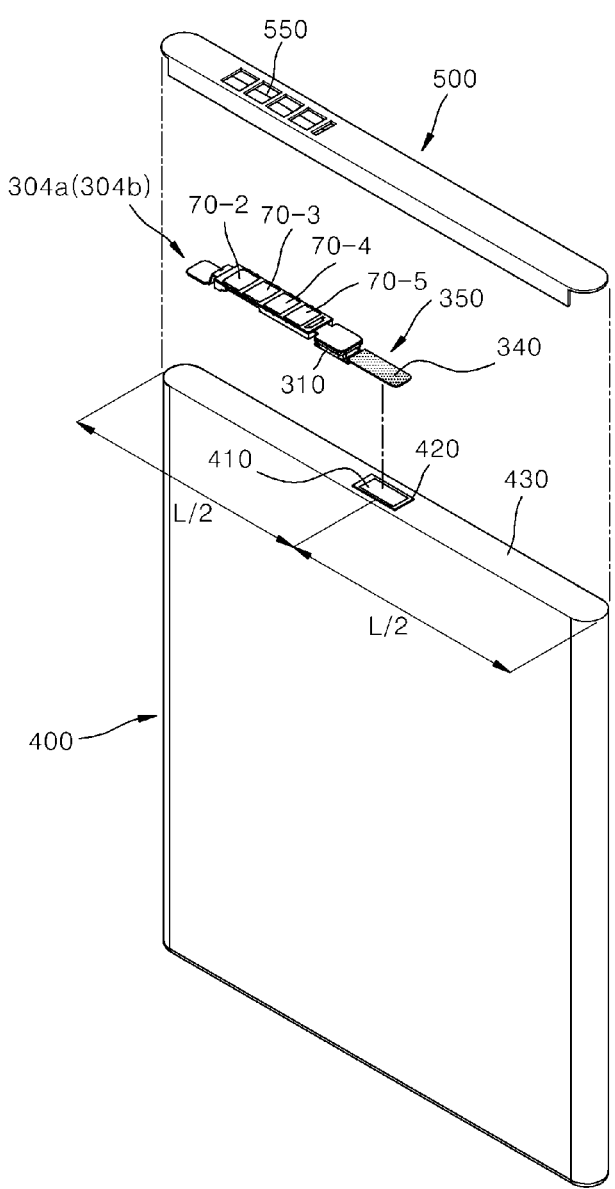
FIG. 18 is a perspective view showing a process for combining the battery protection circuit module package with the battery can, according to at least some embodiments of the present invention.

FIG. 15 is a perspective view of a positive temperature coefficient (PTC) structure for configuring the battery protection circuit module package, according to at least some embodiments of the present invention, FIG. 16 illustrates the battery protection circuit module package according to at least some embodiments of the present invention, and FIG. 17 is a perspective view showing a process for combining the battery protection circuit module package with the battery can, according to at least some embodiments of the present invention.

Referring to FIGS. 15 to 17, the battery protection circuit module package according to at least some embodiments of the present invention includes the PTC structure 350. The PTC structure 350 includes a PTC device 310, a metal layer 320 adhered to a first surface corresponding to any one of a top surface and a bottom surface of the PTC device 310, and connecting members 330 and 340 having conductivity and adhered to a second surface corresponding to the other of the top surface and the bottom surface of the PTC device 310. The metal layer 320 may be bonded to any one of the first and second internal connection terminal leads B+ and B−, and the connecting members 330 and 340 may be bonded to the electrode terminal 410 of a battery bare cell. For example, the metal layer 320, the connecting members 330 and 340, and the lead frame 50 may be formed of nickel, copper, nickel-plated copper, or other metal. The metal layer 320 may be bonded to any one of the first and second internal connection terminal leads B+ and B− using any one selected from the group consisting of laser welding, resistance welding, soldering, a conductive adhesive (e.g., conductive epoxy), and conductive tape.

The PTC device 310 may be produced by, for example, dispersing conductive particles in a crystalline polymer. Accordingly, the PTC device 310 serves as a current path between the metal layer 320 and the connecting members 330 and 340 at a temperature equal to or less than a set temperature. However, if overcurrent occurs and the temperature increases above the set temperature, the crystalline polymer expands, the conductive particles dispersed in the crystalline polymer are disconnected from each other, and thus a resistance value is rapidly increased. Accordingly, the flow of the current between the metal layer 320 and the connecting members 330 and 340 is blocked or reduced. As described above, since the flow of a current may be blocked by the PTC device 310, the PTC device 310 serves as a safety device for preventing a burst of a battery. If the PTC device 310 is cooled under the set temperature, the crystalline polymer contracts, the conductive particles recover connections therebetween, and thus the current flows appropriately.

The terminal lead frame 70 for configuring the battery protection circuit module package 304a or 304b is electrically connected to the electrode terminal 410 of the battery bare cell by disposing the PTC structure 350 therebetween. For example, the second internal connection terminal lead B− or 70-7 of the terminal lead frame 70 may be electrically connected to the negative terminal 410 of the battery bare cell by disposing the PTC structure 350 therebetween. That is, the second internal connection terminal lead B− or 70-7 of the terminal lead frame 70 is bonded to the metal layer 320 and is electrically connected via the PTC device 310 and the connecting members 330 and 340 to the negative terminal 410 of the battery bare cell. In this case, the metal layer 320 may be configured to be restricted within the top surface of the PTC device 310, and the connecting members 330 and 340 may be configured to extend from the bottom surface of the PTC device 310 to the negative terminal 410 of the battery bare cell. The connecting members of the PTC structure 350 may include the first connecting member 330 adhered to a surface of the PTC device 310, and the second connecting member 340 connected to the first connecting member 330 and extending to the negative terminal 410 of the battery bare cell. Since the second connecting member 340 should have an appropriate level to be bonded to the negative terminal 410, a part where the first and second connecting members 330 and 340 are connected to each other may be bent. The second connecting member 340 may be bonded to the negative terminal 410 of the battery bare cell using any one selected from the group consisting of laser welding, resistance welding, soldering, a conductive adhesive (e.g., conductive epoxy), and conductive tape.

In the battery protection circuit module package 304a or 304b having the above-described structure, the length of the terminal lead frame 70 may be set in such a manner that the terminal lead frame 70 is provided at a side part based on the center of a top surface of the battery bare cell (e.g., the negative terminal 410). Alternatively, the length of the terminal lead frame 70 may be set in such a manner that the battery protection circuit module package 304a or 304b combined with the PTC structure 350 is provided at a side part based on the center of the top surface of the battery bare cell (e.g., the negative terminal 410). For example, the length of the battery protection circuit module package 304a or 304b combined with the PTC structure 350 may be a half L/2 of a total length L of the cap plate 430.

As described above, since electrical connection between the second internal connection terminal lead B− and the PTC device 310 is achieved using the metal layer 320 restricted within the top surface of the PTC device 310, the PTC device 310 may be provided directly under the second internal connection terminal lead B−. Due to the above-described configuration of the PTC structure 350 and the configuration in which the device package 302a or 302b is mounted on the terminal lead frame 70, the battery protection circuit module package 304a or 304b according to some embodiments of the present invention has four or more external connection terminals 70-2, 70-3, 70-4, 70-5, and 70-6 and is able to reduce the length of the battery protection circuit module package 300 combined with the PTC structure 350 to, for example, the half L/2 of the total length L of the cap plate 430. If the PTC device 310 is not provided directly under the second internal connection terminal lead B− but is provided to be spaced apart therefrom in a length direction, the length of the battery protection circuit module package 300 combined with the PTC structure 350 relatively increases. However, since the PTC device 310 is provided directly under the second internal connection terminal lead B−, the first internal connection terminal lead B+ may be bent in the form of a gull to horizontally adjust the level of the battery protection circuit module package 300.

According to the above-described embodiments of the present invention, since a battery protection circuit module package is mountable using only a side part of a cap plate based on a negative terminal of a battery, the battery may achieve a small size or a high capacity. For example, by further providing a cell on the other side part based on the negative terminal, in which the battery protection circuit module package is not provided, the capacity of the battery may be increased or a chip having another function may be additionally provided, and thus products having such battery may be reduced in size.

The battery protection circuit module package according to the above-described embodiments of the present invention has four or more external connection terminals and is mountable using only a side part based on the center of a top surface of a battery bare cell, the battery may achieve a small size or a high capacity. For example, by further providing a cell on the other side part based on the electrode cell, the capacity of the battery may be increased or a chip having another function may be additionally provided, and thus products having such battery may be reduced in size. However, the battery protection circuit module package according to embodiments of the present invention is not limited to use only a side part and may be configured to use the whole top surface of the electrode cell of the battery.

Furthermore, if a device package of the battery protection circuit module package according to the above-described embodiments of the present invention uses a lead frame, compared to a case in which a battery protection circuit is mounted on a PCB and then leads are boned onto the PCB, since a battery protection circuit may be mounted and leads connectable to a battery cell may be provided using only the lead frame, a manufacturing cost may be reduced and a total height may be remarkably reduced. That is, since the PCB typically has a thickness of about 2 mm while the lead frame has a thickness of about 0.8 mm, battery size may be reduced or battery capacity may be increased by a value corresponding to the difference in thickness therebetween.

In addition, since an electrical connection member such as bonding wire or bonding ribbon is provided on the lead frame to configure the battery protection circuit, a process for designing and producing the lead frame for configuring the battery protection circuit may be simplified. If the electrical connection member is not employed to configure the battery protection circuit in the embodiments of the present invention, the configuration of a plurality of leads for configuring the lead frame may be very complicated and thus an appropriate lead frame may not be efficiently provided.

Besides, according to the above-described embodiments of the present invention, a connection structure between a PTC device and the lead frame may be simplified or reduced in size without constantly maintaining the size of the PTC device, and thus a PTC structure may be reduced in size.

While the present invention has been particularly shown and described with reference to embodiments thereof, it will be understood by those of ordinary skill in the art that various changes in form and details may be made therein without departing from the spirit and scope of the present invention as defined by the following claims.

The invention claimed is:

1. A battery protection circuit module package comprising:
    a terminal lead frame comprising:
        a first internal connection terminal lead and a second internal connection terminal lead structurally separate and spaced apart from each other and provided at two edges of the terminal lead frame, the first internal connection terminal lead being electrically connected to a first electrode terminal of a battery bare cell and the second internal connection terminal being electrically connected to a second electrode terminal of the battery bare cell; and
        a plurality of external connection terminal leads provided between the first and second internal connection terminal leads and serving as a plurality of external connection terminals; and
    a device package comprising a substrate mounted on the terminal lead frame to be electrically connected to the terminal lead frame, and providing a battery protection circuit device on the substrate,
    wherein the substrate comprises a mounting lead frame having a plurality of mounting leads spaced apart from each other,
    wherein the battery protection circuit device is directly mounted on the mounting lead frame and comprises a protection integrated circuit (IC), a field effect transistor (FET), and one or more passive devices, and
    wherein the passive devices are provided to interconnect at least some of the mounting leads spaced apart from each other, and further comprises an electrical connection member for electrically interconnecting any two selected from the group consisting of the protection IC, the FET, and the mounting leads, thereby configuring a battery protection circuit without using a printed circuit board (PCB).

2. The battery protection circuit module package of claim 1, wherein the device package provides exposure terminals on a bottom surface of the device package.

3. The battery protection circuit module package of claim 1, wherein the device package provides exposure terminals on a top surface and a bottom surface of the device package.

4. The battery protection circuit module package of claim 3, wherein the device package further comprises:
    a near field communication (NFC) matching device provided on the substrate; and
    an encapsulant for encapsulating the battery protection circuit device and the NFC matching device to expose the exposure terminals,
    wherein one of the external connection terminals is an NFC external connection terminal, and
    wherein the exposure terminals provided on the top surface of the device package are provided to electrically interconnect an NFC antenna and the NFC matching device.

5. The battery protection circuit module package of claim 2, wherein the device package further comprises:
    an authentication chip circuit composition provided on the substrate; and
    an encapsulant for encapsulating the battery protection circuit device and the authentication chip circuit composition to expose the exposure terminals, and
    wherein one of the external connection terminals is an authentication chip external connection terminal.

6. The battery protection circuit module package of claim 2, wherein the device package further comprises:
    a fuel gauge circuit composition provided on the substrate; and
    an encapsulant for encapsulating the battery protection circuit device and the fuel gauge circuit composition to expose the exposure terminals, and
    wherein one of the external connection terminals is a fuel gauge external connection terminal.

7. The battery protection circuit module package of claim 2, wherein the exposure terminals provided on the bottom surface of the device package facing the terminal lead frame are bonded and electrically connected to at least parts of the terminal lead frame.

8. The battery protection circuit module package of claim 2, further comprising an encapsulant for encapsulating the battery protection circuit device to expose the exposure terminals.

9. The battery protection circuit module package of claim 1, wherein the device package is mounted on the terminal lead frame using surface mounting technology.

10. The battery protection circuit module package of claim 1, wherein the electrical connection member comprises bonding wire or bonding ribbon.

11. The battery protection circuit module package of claim 1, wherein the passive devices are not inserted and fixed into the mounting lead frame but are mounted and fixed onto at least parts of a surface of the mounting lead frame using surface mounting technology.

12. The battery protection circuit module package of claim 1, wherein the protection IC and the FET are not inserted and fixed into the mounting lead frame in a form of a semiconductor package but are mounted and fixed onto at least parts of a surface of the mounting lead frame using surface mounting technology in a form of a chip die not encapsulated with an encapsulant.

13. The battery protection circuit module package of claim 1, wherein the first and second electrode terminals of the battery bare cell comprise a plate having first polarity, and an electrode cell provided at a center of the plate and having second polarity, and wherein the first internal connection terminal lead is directly bonded and electrically connected to the plate having the first polarity, and the second internal connection terminal lead is directly bonded and electrically connected to the electrode cell having the second polarity.

14. The battery protection circuit module package of claim 13, wherein the terminal lead frame and the device package are provided at a side part of a top surface of the battery bare cell based on the electrode cell having the second polarity.

15. The battery protection circuit module package of claim 13, wherein the first internal connection terminal lead is bent in a form of a gull to be bonded to the first electrode terminal of the battery bare cell.

16. The battery protection circuit module package of claim 1, wherein the first and second internal connection terminal leads are bonded to the first and second electrode terminals of the battery bare cell using any one selected from the group consisting of laser welding, resistance welding, soldering, a conductive adhesive (e.g., conductive epoxy), and conductive tape.

17. The battery protection circuit module package of claim 1, wherein the terminal lead frame is formed of nickel or nickel-plated copper.

18. The battery protection circuit module package of claim 1, wherein the external connection terminals comprise four or more external connection terminals.

19. The battery protection circuit module package of claim 1, further comprising a positive temperature coefficient (PTC) structure comprising:

a PTC device;

a metal layer adhered to a first surface corresponding to any one of a top surface and a bottom surface of the PTC device; and a connecting member adhered to a second surface corresponding to the other of the top surface and the bottom surface of the PTC device, wherein the metal layer is bonded and electrically connected to one of the first and second internal connection terminal leads, and the connecting member is bonded and electrically connected to the electrode terminal of the battery bare cell.

* * * * *